(12) United States Patent
Huang

(10) Patent No.: US 11,101,203 B2
(45) Date of Patent: Aug. 24, 2021

(54) WIRING STRUCTURE COMPRISING INTERMEDIATE LAYER INCLUDING A PLURALITY OF SUB-LAYERS

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/528,325

(22) Filed: Jul. 31, 2019

(65) Prior Publication Data

US 2021/0035896 A1 Feb. 4, 2021

(51) Int. Cl.
*H01L 23/498* (2006.01)
*H01L 21/3205* (2006.01)
*H05K 3/46* (2006.01)
*H05K 3/42* (2006.01)

(52) U.S. Cl.
CPC .... *H01L 23/49822* (2013.01); *H01L 21/3205* (2013.01); *H05K 3/4644* (2013.01); *H01L 23/49816* (2013.01); *H05K 3/429* (2013.01)

(58) Field of Classification Search
CPC ......... H01L 23/49822; H01L 23/49816; H01L 21/3205; H05K 3/4644
See application file for complete search history.

(56) References Cited

U.S. PATENT DOCUMENTS

| 6,190,834 B1* | 2/2001 | Narahara | C08F 290/14 430/284.1 |
| 2006/0180341 A1* | 8/2006 | Kariya | H05K 1/115 174/255 |
| 2010/0300602 A1* | 12/2010 | Ichiyanagi | H01L 28/40 156/89.12 |

* cited by examiner

*Primary Examiner* — Quoc D Hoang
(74) *Attorney, Agent, or Firm* — Foley & Lardner LLP

(57) ABSTRACT

A wiring structure includes an upper conductive structure, a lower conductive structure and an intermediate layer. The upper conductive structure includes at least one dielectric layer and at least one circuit layer in contact with the dielectric layer. The lower conductive structure includes at least one dielectric layer and at least one circuit layer in contact with the dielectric layer. The intermediate layer is disposed between the upper conductive structure and the lower conductive structure and bonds the upper conductive structure and the lower conductive structure together. The upper conductive structure is electrically connected to the lower conductive structure. The intermediate layer includes a plurality of sub-layers. Each of the sub-layers is formed from a polymeric material. A boundary is formed between two adjacent sub-layers.

26 Claims, 34 Drawing Sheets

WIRING STRUCTURE COMPRISING INTERMEDIATE LAYER INCLUDING A PLURALITY OF SUB-LAYERS

BACKGROUND

1. Field of the Disclosure

The present disclosure relates to a wiring structure, and to a wiring structure including at least two conductive structures attached or bonded together by an intermediate layer.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes an upper conductive structure, a lower conductive structure and an intermediate layer. The upper conductive structure includes at least one dielectric layer and at least one circuit layer in contact with the dielectric layer. The lower conductive structure includes at least one dielectric layer and at least one circuit layer in contact with the dielectric layer. The intermediate layer is disposed between the upper conductive structure and the lower conductive structure and bonds the upper conductive structure and the lower conductive structure together. The upper conductive structure is electrically connected to the lower conductive structure. The intermediate layer includes a plurality of sub-layers. Each of the sub-layers is formed from a polymeric material. A boundary is formed between two adjacent sub-layers.

In some embodiments, a wiring structure includes an upper conductive structure, a lower conductive structure and an intermediate layer. The upper conductive structure includes at least one dielectric layer and at least one circuit layer in contact with the dielectric layer. The lower conductive structure includes at least one dielectric layer and at least one circuit layer in contact with the dielectric layer. The intermediate layer is disposed between the upper conductive structure and the lower conductive structure and bonds the upper conductive structure and the lower conductive structure together. The upper conductive structure is electrically connected to the lower conductive structure. The intermediate layer includes a plurality of sub-layers. The materials of the sub-layers are different from a material of the dielectric layer of the lower conductive structure and a material of the dielectric layer of the upper conductive structure. The materials of at least two of the sub-layers are different from each other.

In some embodiments, a wiring structure includes a low-density stacked structure, a high-density stacked structure and an intermediate layer. The low-density stacked structure includes at least one dielectric layer and at least one low-density circuit layer in contact with the dielectric layer. The high-density stacked structure is disposed on the low-density stacked structure. The high-density stacked structure includes at least one dielectric layer and at least one high-density circuit layer in contact with the dielectric layer of the high-density stacked structure. The intermediate layer is disposed between the low-density stacked structure and the high-density stacked structure and bonds the low-density stacked structure and the high-density stacked structure together. The low-density stacked structure is electrically connected to the high-density stacked structure. The intermediate layer includes a plurality of sub-layers. Each of the sub-layers is formed from a polymeric material. A boundary is formed between two adjacent sub-layers.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
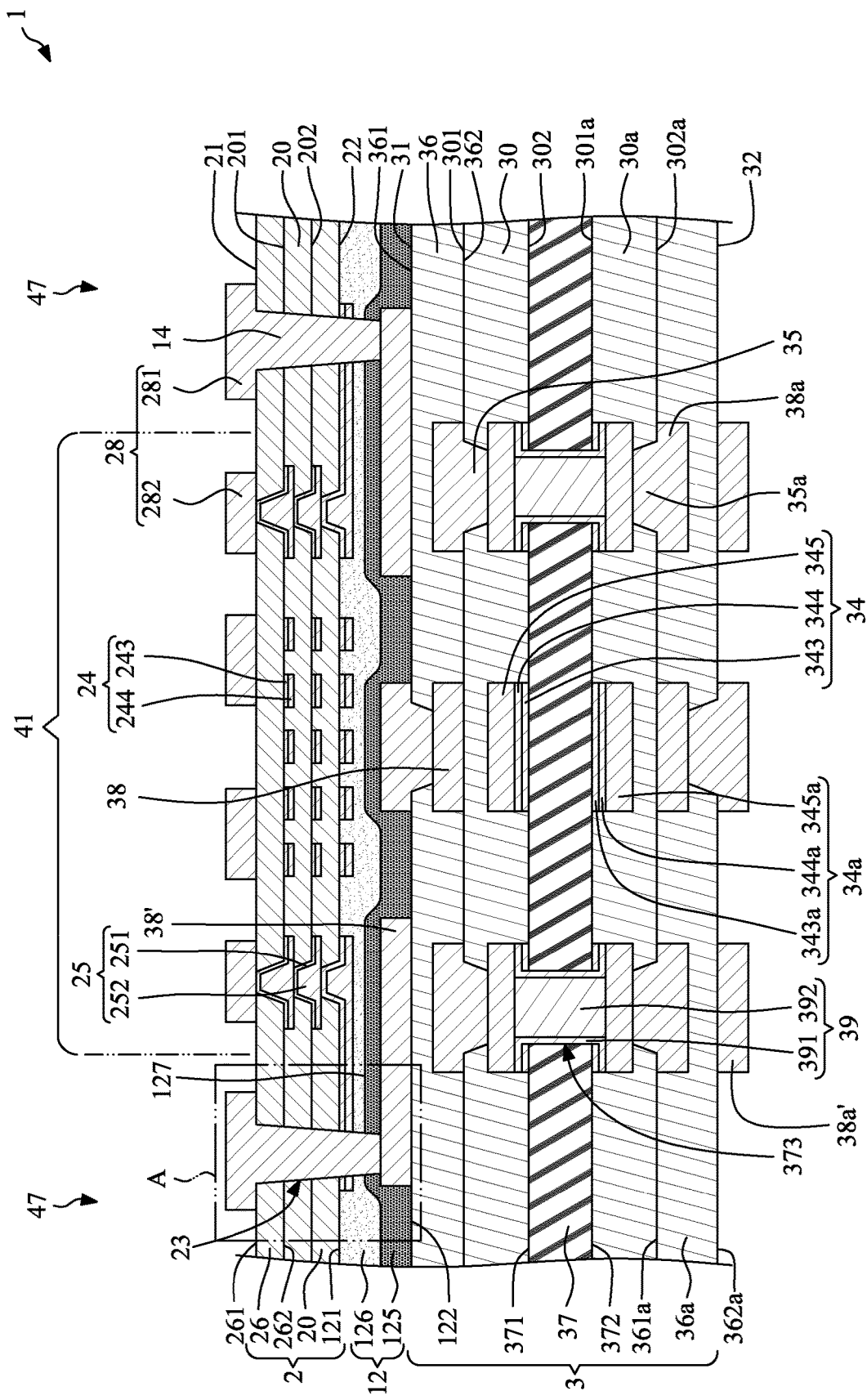
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes an upper conductive structure 2, a lower conductive structure 3, an intermediate layer 12 and at least one upper through via 14.

The upper conductive structure 2 includes at least one dielectric layer (including, for example, two first dielectric layers 20 and a second dielectric layer 26) and at least one circuit layer (including, for example, three first circuit layers 24 and a second circuit layer 28 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the three circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, about 2 times or greater, or about 5 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21 and a bottom surface 22 opposite to the top surface 21. The upper conductive structure 2 includes a plurality of dielectric layers (e.g., the two first dielectric layers 20 and the second dielectric layer 26), a plurality of circuit layers (e.g., the three first circuit layers 24 and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201. The second dielectric layer 26 has a top surface 261 and a bottom surface 262 opposite to the top surface 261. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20.

The first circuit layers 24 may be fan-out circuit layers or redistribution layers (RDLs), and an L/S of the first circuit layers 24 may be less than or equal to about 2 μm/about 2 μm, or less than or equal to about 1.8 μm/about 1.8 μm. In some embodiments, the first circuit layer 24 is embedded in the corresponding first dielectric layer 20, and a top surface of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 1, the bottommost first circuit layer 24 is disposed on and protrudes from the bottom surface 22 of the upper conductive structure 2 (e.g., the bottom surface 202 of the bottommost first dielectric layer 20). In addition, the second circuit layer 28 is disposed on and protrudes from the top surface 21 of the upper conductive structure 2 (e.g., the top surface 261 of the second dielectric layer 26), and may include at least one pad 281 and at least one trace 282 electrically connected to the pad 281. An L/S of the second circuit layer 28 may be greater than or equal to the L/S of the first circuit layer 24. As illustrated in the embodiment of FIG. 1, a horizontally connecting or extending circuit layer is omitted in the second dielectric layer 26.

The upper conductive structure 2 includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

The first upper dielectric layer 30 is disposed on the top surface 371 of the core portion 37, and has a top surface 301 and a bottom surface 302 opposite to the top surface 301. The second upper dielectric layer 36 is stacked or disposed on the first upper dielectric layer 30, and has a top surface 361 and a bottom surface 362 opposite to the top surface 361. Thus, the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. The second lower dielectric layer 36a is stacked or disposed on the first lower dielectric layer 30a, and has a top surface 361a and a bottom surface 362a opposite to the top surface 361a. As shown in FIG. 1, the top surface 31 of the lower conductive structure 3 is the top surface 361 of the second upper dielectric layer 36, and the bottom surface 32 of the lower conductive structure 3 is the bottom surface 362a of the second lower dielectric layer 36a.

A thickness of each of the dielectric layers (e.g., the first dielectric layers 20 and the second dielectric layer 26) of the upper conductive structure 2 is less than or equal to about 40%, less than or equal to about 35%, less than or equal to about 30% of a thickness of each of the dielectric layers (e.g., the first upper dielectric layer 30, the second upper dielectric layer 36, the first lower dielectric layer 30a and the second lower dielectric layer 36a) of the lower conductive structure 3. For example, a thickness of each of the dielectric layers (e.g., the first dielectric layers 20 and the second dielectric layer 26) of the upper conductive structure 2 may be less than or equal to about 7 μm, and a thickness of each of the dielectric layers (e.g., the first upper dielectric layer 30, the second upper dielectric layer 36, the first lower dielectric layer 30a and the second lower dielectric layer 36a) of the lower conductive structure 3 may be about 40 μm.

An L/S of the first upper circuit layer 34 may be greater than or equal to about 10 μm/about 10 μm. Thus, the L/S of the first upper circuit layer 34 may be greater than or equal to about five times the L/S of the first circuit layers 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the first circuit layers 24 of the upper conductive structure 2. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure.

In addition, in some embodiments, the second upper circuit layer 38' is disposed on and protrudes from the top surface 361 of the second upper dielectric layer 36. In some embodiments, the second upper circuit layer 38 is electrically connected to the second upper circuit layer 38' through the upper interconnection vias 35. That is, the upper interconnection vias 35 are disposed between the second upper circuit layers 38, 38' for electrically connecting the second upper circuit layers 38, 38'. In some embodiments, the second upper circuit layer 38' and the upper interconnection vias 35 are formed integrally as a monolithic or one-piece structure.

The structures and materials of the first lower circuit layer 34a, the second lower circuit layer 38a, the lower interconnection vias 35a and the second lower circuit layer 38a' are substantially similar to or same as the structures and materials of the first upper circuit layer 34, the second upper circuit layer 38, the upper interconnection vias 35 and the second upper circuit layer 38', respectively. For example, the first lower circuit layer 34a may include a first metallic layer 343a, a second metallic layer 344a and a third metallic layer 345a. The first metallic layer 343a is disposed on the bottom surface 372 of the core portion 37, the second metallic layer 344a is disposed on the first metallic layer 343a, and the third metallic layer 345a is disposed on the second metallic layer 344a. In addition, the lower interconnection vias 35a are disposed between the second lower circuit layers 38a, 38a' for electrically connecting the second lower circuit layers 38a, 38a'. In some embodiments, the second lower circuit layer 38a' and the lower interconnection vias 35a are formed integrally as a monolithic or one-piece structure.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. The intermediate layer 12 may include a plurality of sub-layers (e.g., including, for example, a first sub-layer 125 and a second sub-layer 126), and each of the sub-layers 125, 126 is formed from a polymeric material. In some embodiments, the sub-layers (e.g., the first sub-layer 125 and the second sub-layer 126) of the intermediate layer 12 may be an adhesion layer that is cured from an adhesive material (e.g., includes a cured adhesive material such as an adhesive polymeric material). That is, a material of each of the polymeric materials is different from a material of the dielectric layers 20, 26 of the upper conductive structure 2 and a material of the dielectric layers 30, 36, 30a, 36a of the lower conductive structure 3. The sub-layers (e.g., the first sub-layer 125 and the second sub-layer 126) of the intermediate layer 12 may be neither a portion of the upper conductive structure 2 nor a portion of the lower conductive structure 3. Further, each of the polymeric materials has a viscosity, and the viscosities of the polymeric materials of two adjacent sub-layers (e.g., the first sub-layer 125 and the second sub-layer 126) are different from each other. As shown in FIG. 1, the materials of at least two of the sub-layers (e.g., the first sub-layer 125 and the second sub-layer 126) are different from each other, and a boundary 127 is formed between two adjacent sub-layers (e.g., the first sub-layer 125 and the second sub-layer 126). The intermediate layer 12 does not include a horizontally extending circuit layer on the boundary 127. There is no horizontally extending circuit layer disposed adjacent to the boundary 127.

The intermediate layer 12 has a top surface 121 and a bottom surface 122 opposite to the top surface 121. The top surface 121 of the intermediate layer 12 contacts the bottom surface 22 of the upper conductive structure 2, and the bottom surface 122 of the intermediate layer 12 contacts the top surface 31 of the lower conductive structure 3. Thus, the bottommost first circuit layer 24 of the upper conductive structure 2 and the topmost circuit layer 38' (e.g., the second upper circuit layer 38') of the lower conductive structure 3 are embedded in the intermediate layer 12.

As shown in FIG. 1, the intermediate layer 12 includes the first sub-layer 125 formed from a first polymeric material and the second sub-layer 126 formed from a second polymeric material. A viscosity of the first polymeric material is greater than a viscosity of the second polymeric material. For example, the viscosity of the first polymeric material is greater than about three times, five times, or ten times the viscosity of the second polymeric material. Thus, the first polymeric material of the first sub-layer 125 is used to provide adhesion, and the second sub-layer 126 is used to provide smooth flat surface. In some embodiments, a material of the first polymeric material may include polyimide (PI), and a material of the second polymeric material may include Ajinomoto build-up film (ABF). In some embodiments, a material of the intermediate layer 12 (e.g., the first sub-layer 125 and the second sub-layer 126) is transparent, and can be seen through by human eyes or machine.

As shown in FIG. 1, the first sub-layer 125 is in contact with the lower conductive structure 3 and covers a topmost circuit layer (e.g., the second upper circuit layer 38') of the lower conductive structure 3. The top surface of the first sub-layer 125 (or the first polymeric material) is substantially conformal with the top surface 31 and the second upper circuit layer 38' due to a relative high viscosity of the first polymeric material and a less thickness of the first sub-layer 125 (or the first polymeric material). Thus, the top surface of the first sub-layer 125 (or the first polymeric material) is not a smooth flat surface, which may reduce the bonding quality between the upper conductive structure 2 and the lower conductive structure 3. To address such concern, the second polymeric material that has a relative low viscosity is applied on the first polymeric material. The top surface of the second polymeric material (or the second sub-layer 126) is a substantially smooth flat surface. Thus, when the upper conductive structure 2 is attached to the second polymeric material (or the second sub-layer 126), the bonding quality between the upper conductive structure 2 and the lower conductive structure 3 is improved. Meanwhile, the second polymeric material (or the second sub-layer 126) is in contact with the upper conductive structure 2. In addition, a thickness of the intermediate layer 12 (e.g., a sum of a thickness of the first sub-layer 125 and a thickness of the second sub-layer 126) may be reduced.

In some embodiments, a bonding force between two adjacent dielectric layers (e.g., two adjacent first dielectric layers 20) of the upper conductive structure 2 is greater than a bonding force between a dielectric layer (e.g., the bottommost first dielectric layers 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layers 20) of the upper conductive structure 2 and the intermediate layer 12, such as about 1.1 times or greater, about 1.3 times or greater, or about 1.5 times or greater in terms of root mean squared surface roughness. In some embodiments, a bonding force between the first sub-layer 125 and the lower conductive structure 3 may be greater than a bonding force between the second sub-layer 126 and the upper conductive structure 2.

The wiring structure 1 may define a through hole 23 to extend through at least a portion of the upper conductive structure 2 and the intermediate layer 12, and expose a portion of the topmost circuit layer (e.g., the top surface of the second upper circuit layer 38') of the lower conductive structure 3. The upper through via 14 is formed or disposed in the corresponding through hole 23, and is formed of a metal, a metal alloy, or other conductive material. Thus, the upper through via 14 extends through at least a portion of the upper conductive structure 2 and the intermediate layer 12, and is electrically connected to the topmost circuit layer (e.g., the top surface of the second upper circuit layer 38') of the lower conductive structure 3. As shown in FIG. 1, the upper through via 14 extends through and contacts the bottommost first circuit layer 24 of the upper conductive structure 2, and terminates at or on, and contacts a portion of the topmost circuit layer (e.g., the top surface of the second upper circuit layer 38') of the lower conductive structure 3. Thus, the upper conductive structure 2 is electrically connected to the lower conductive structure 3 through the upper through via 14.

In some embodiments, a low-density circuit layer (e.g., the second upper circuit layer 38') of the low-density conductive structure (e.g., the lower conductive structure 3) is electrically connected to a high-density circuit layer (e.g., the bottommost first circuit layer 24) of the high-density conductive structure (e.g., the upper conductive structure 2) solely by the upper through via 14. A length (along a longitudinal axis) of the upper through via 14 is greater than a thickness of the high-density conductive structure (e.g., the upper conductive structure 2). Further, the upper through via 14 tapers downwardly; that is, a size of a top portion of the upper through via 14 is greater than a size of a bottom portion of the upper through via 14. Thus, a tapering direction of the inner via 25 of the upper conductive structure 2 is different from a tapering direction of the upper through via 14. In some embodiments, the upper through via 14 is a monolithic structure or a one-piece structure having a homogeneous material composition. The upper through via 14 and the pad 281 of the second circuit layer 28 may be formed integrally as a monolithic or one-piece structure.

As shown in FIG. 1, the upper conductive structure 2 includes a high-density region 41 and a low-density region 47. In some embodiments, a density of a circuit line (including, for example, a trace or a pad) in the high-density region 41 is greater than a density of a circuit line in the low-density region 47. Alternatively, or in combination, an L/S of a circuit layer within the high-density region 41 is less than an L/S of a circuit layer within the low-density region 47. Further, the upper through via 14 is disposed in the low-density region 47 of the high-density conductive structure (e.g., the upper conductive structure 2). In some embodiments, the high-density region 41 may be a chip bonding area.

As shown in the embodiment illustrated in FIG. 1, the wiring structure 1 is a combination of the upper conductive structure 2 and the lower conductive structure 3, in which the first circuit layer 24 of the upper conductive structure 2 has fine pitch, high yield and low thickness; and the circuit layers (e.g., the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the first circuit layers 24 of the upper conductive structure 2 and six layers of the circuit layers 34, 38, 38', 34a, 38a, 38a' of the lower conductive structure 3. The manufacturing yield for one layer of the first circuit layers 24 of the upper conductive structure 2 may be 99%, and the manufacturing yield for one layer of the circuit layers 34, 38, 38', 34a, 38a, 38a' of the lower conductive structure 3 may be 90%. Thus, the yield of the wiring structure 1 may be improved. In addition, the warpage of the upper conductive structure 2 and the warpage of the lower conductive structure 3 are separated and will not influence each other. That is, the warpage of the lower conductive structure 3 will not be accumulated onto the warpage of the upper conductive structure 2. Thus, the yield of the wiring structure 1 may be further improved.

In addition, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

Figure 2:
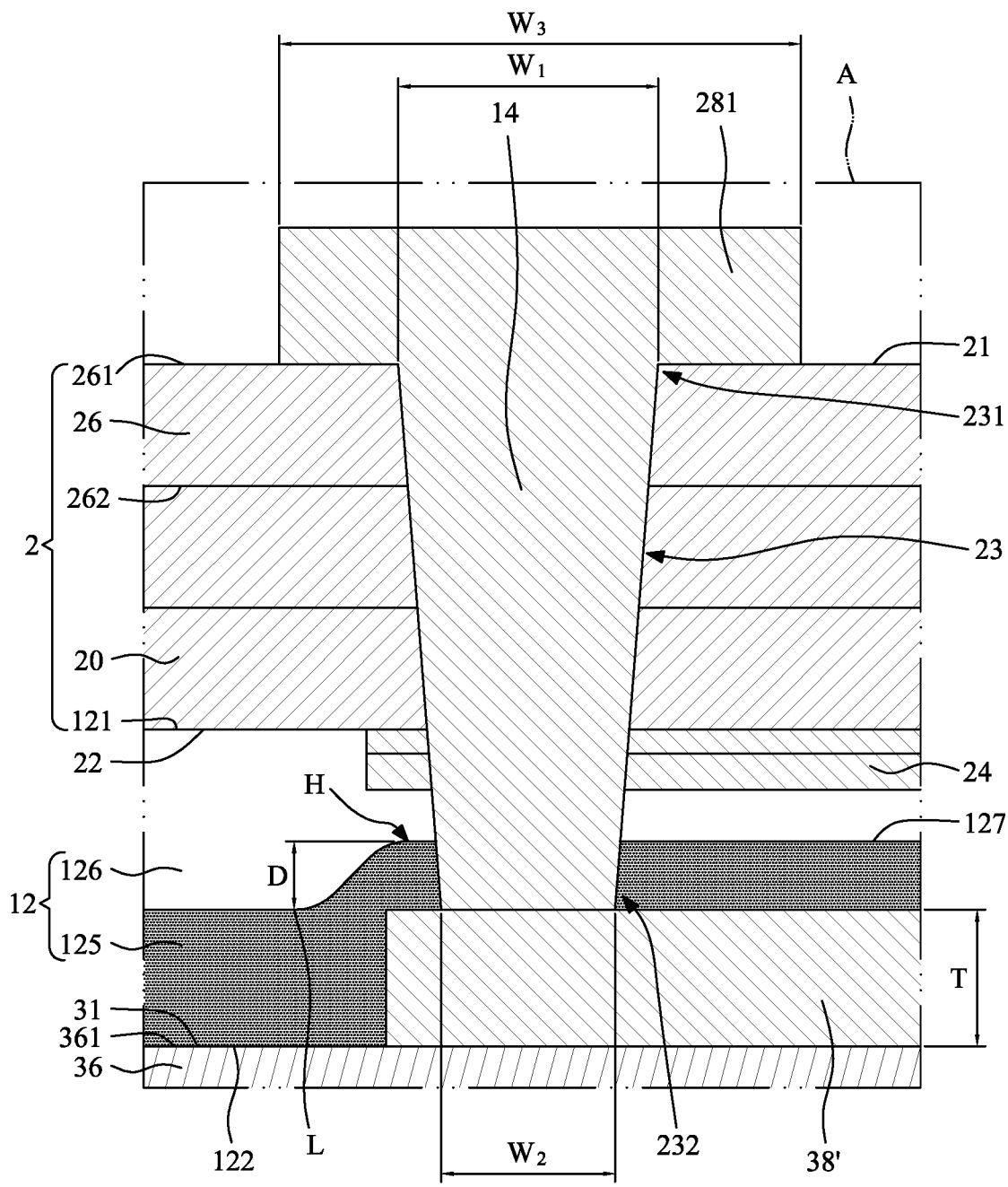
FIG. 2 illustrates an enlarged view of a region "A" in FIG. 1.
Figure 3:
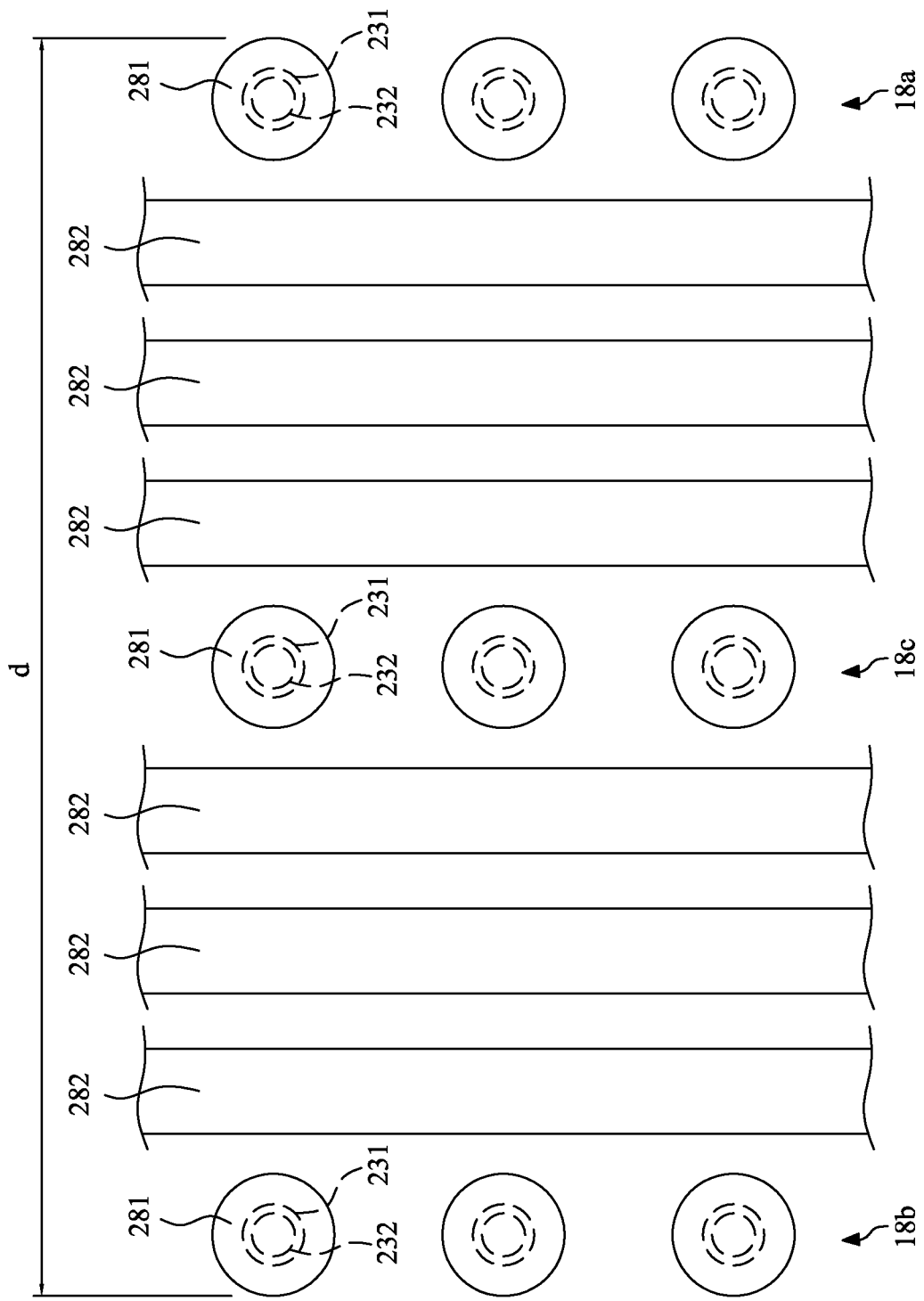
FIG. 3 illustrates a partially enlarged view of a top view of an upper conductive structure of FIG. 1.

FIG. 2 illustrates an enlarged view of a region "A" in FIG. 1. FIG. 3 illustrates a partially enlarged view of a top view of an upper conductive structure 2 of FIG. 1. As shown in FIG. 2, the first sub-layer 125 has a top surface (e.g., the boundary 127). The top surface (e.g., the boundary 127) of the first sub-layer 125 has a highest point H and a lowest point L, and a height difference D between the highest point H and the lowest point L is greater than 3 greater than 5 or greater than 7 For example, the height difference D between the highest point H and the lowest point L is greater than one third or one half of a thickness T of the topmost circuit layer (e.g., the second upper circuit layers 38') of the lower conductive structure 3. In addition, the through hole 23 includes a top portion 231 having a first width $W_1$ and a bottom portion 232 having a second width $W_2$. Since the through hole 23 may be formed by laser drilling, the second width $W_2$ may be less than the first width $W_1$. For example, the second width $W_2$ may be 70% or 75% of the first width $W_1$. That is, a ratio of the second width $W_2$ to the first width $W_1$ may be fixed. Thus, if the value of the second width $W_2$ is fixed, the value of the first width $W_1$ is proportion to the total thickness of the upper conductive structure 2 and the intermediate layer 12 that the through hole 23 extends through. In other words, the greater total thickness of the upper conductive structure 2 and the intermediate layer 12 will result in greater first width $W_1$. Further, the value of the third width $W_3$ of the pad 281 of the second circuit layer 28 may be in proportion to the value of the first width $W_1$ of the top portion 231 of the through hole 23. Therefore, the third width $W_3$ of the pad 281 may be in proportion to the total thickness of the upper conductive structure 2 and the intermediate layer 12 that the through hole 23 extends through.

As shown in FIG. 3, the pads 281 are arranged in a plurality of rows (including, for example, a first row 18a, a second row 18b and a third row 18c). In the illustrated embodiment, the third width $W_3$ (e.g., the diameter) of the pad 281 may be in proportion to the total thickness of the upper conductive structure 2 and the intermediate layer 12, and a thickness of the intermediate layer 12 (e.g., a sum of a thickness of the first sub-layer 125 and a thickness of the second sub-layer 126) may be reduced as stated above. Thus, the third width $W_3$ (e.g., the diameter) of the pad 281 can be reduced to a small value. If a distance d between the first row 18a and the second row 18b is fixed, the third row 18c and six traces 282 can be disposed between the first row 18a and the second row 18b. In a comparative embodiment, the third width $W_3$ (e.g., the diameter) of the pad 281 is relatively large due to a large thickness of the intermediate layer 12. Thus, when the distance d between the first row 18a and the second row 18b is fixed, the third row 18c may be not further disposed between the first row 18a and the second row 18b, or the number of the traces 282 may be reduced.

Figure 4:
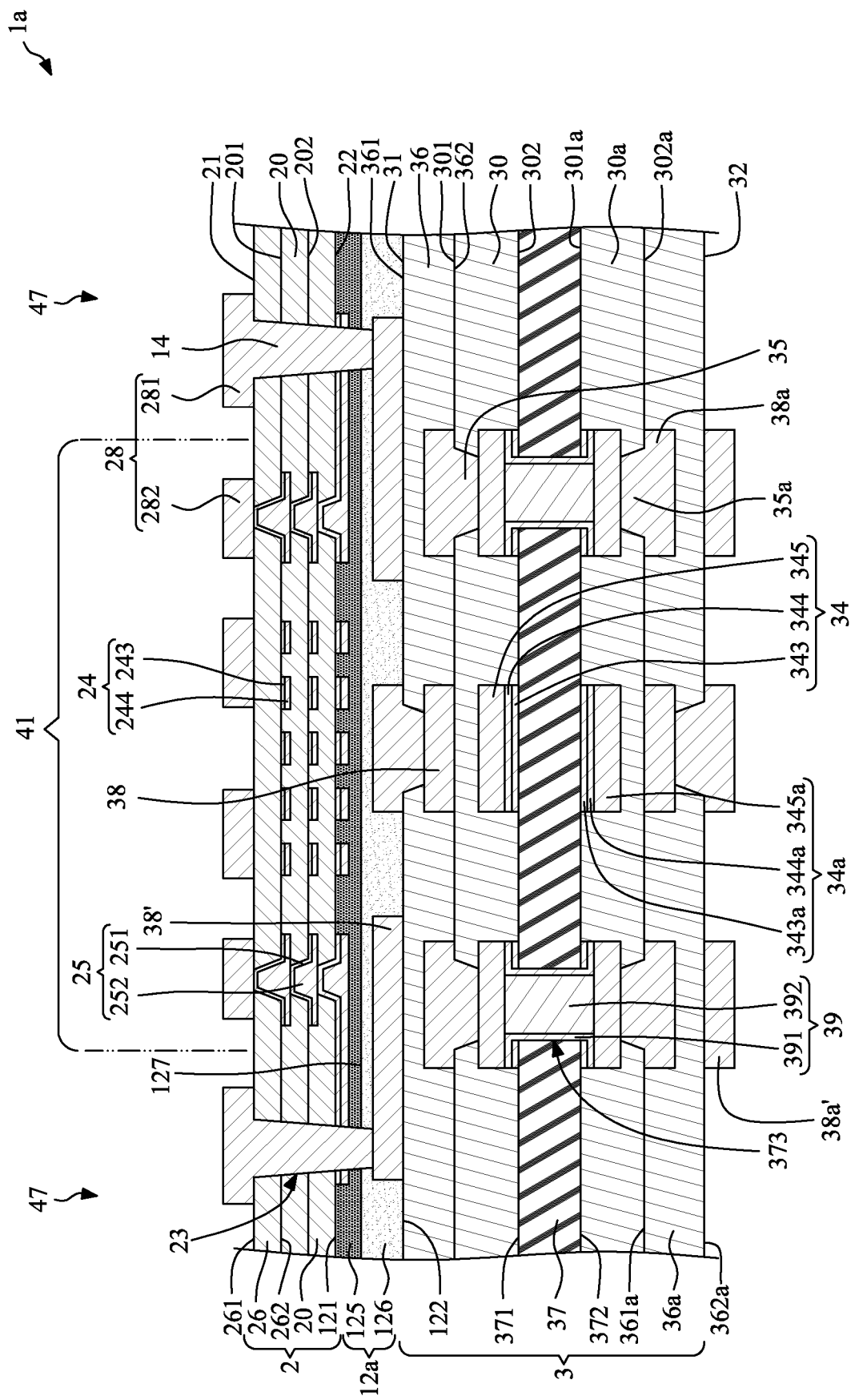
FIG. 4 illustrates a cross-sectional view of a wiring structure according to some embodiments of the present disclosure.

FIG. 4 illustrates a cross-sectional view of a wiring structure 1a according to some embodiments of the present disclosure. The wiring structure 1a is similar to the wiring structure 1 shown in FIG. 1, except for a structure of the intermediate layer 12a. As shown in FIG. 4, the first sub-layer 125 is in contact with the upper conductive structure 2, and the second sub-layer 126 is in contact with the lower conductive structure 3 and covers a topmost circuit layer (e.g., the second upper circuit layers 38') of the lower conductive structure 3. The boundary 127 may be a flat surface. That is, the highest point and the lowest point of the boundary 127 may be close to zero, such as less than 1 μm, less than 0.1 μm, or less than 0.05 μm. In addition, a bonding force between the first sub-layer 125 and the upper conductive structure 2 is greater than a bonding force between the second sub-layer 126 and the lower conductive structure 3.

Figure 5:
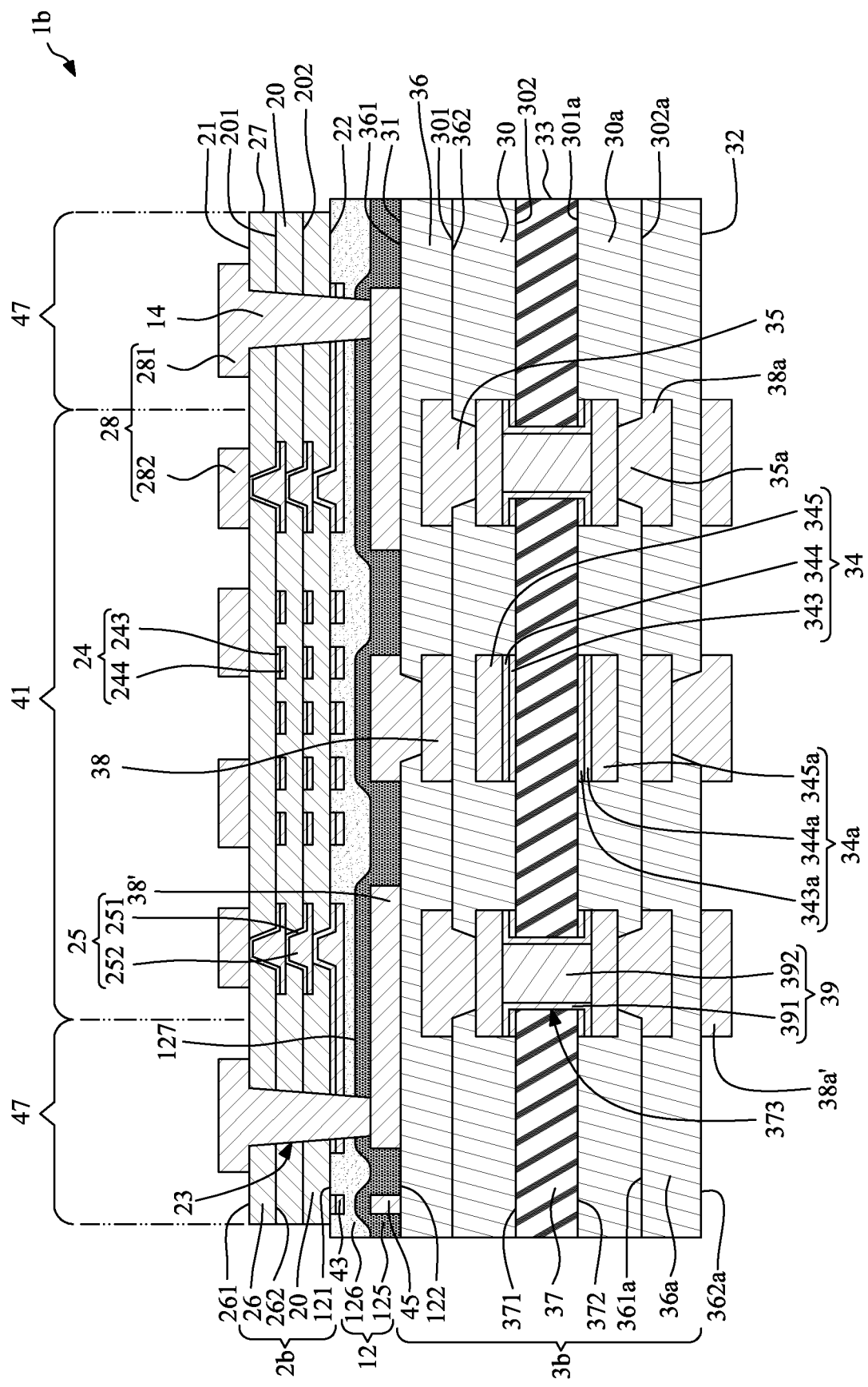
FIG. 5 illustrates a cross-sectional view of a wiring structure according to some embodiments of the present disclosure.

FIG. 5 illustrates a cross-sectional view of a wiring structure 1b according to some embodiments of the present disclosure. The wiring structure 1b is similar to the wiring structure 1 shown in FIG. 1, except for structures of an upper conductive structure 2b and a lower conductive structure 3b. As shown in FIG. 5, the upper conductive structure 2b and the lower conductive structure 3b are both strip structures. Thus, the wiring structure 1b is a strip structure. In some embodiments, the lower conductive structure 3b may be a panel structure that carries a plurality of strip upper conductive structures 2b. Thus, the wiring structure 1b is a panel structure. In addition, a lateral peripheral surface 27 of the upper conductive structure 2b is not coplanar with (e.g., is inwardly recessed from or otherwise displaced from) a lateral peripheral surface 33 of the lower conductive structure 3b.

As shown in FIG. 5, the upper conductive structure 2b includes at least one fiducial mark 43 at a corner thereof, and the lower conductive structure 3b has at least one fiducial mark 45 at a corner thereof. The fiducial mark 43 of the upper conductive structure 2b is aligned with a fiducial mark 45 of the lower conductive structure 3b during a manufacturing process, so that the relative position of the upper conductive structure 2b and the lower conductive structure 3b is secured. In some embodiments, the fiducial mark 43 of the upper conductive structure 2b is disposed on and protrudes from the bottom surface 22 of the upper conductive structure 2b (e.g., the bottom surface 202 of the bottommost first dielectric layer 20). The fiducial mark 43 and the bottommost first circuit layer 24 may be at, or part of, the same layer, and may be formed concurrently. Further, the fiducial mark 45 of the lower conductive structure 3b is disposed on and protrudes from the top surface 31 of the lower conductive structure 3b (e.g., the top surface 361 of the second upper dielectric layer 36). The fiducial mark 45 and the second upper circuit layer 38' may be at, or part of, the same layer, and may be formed concurrently.

Figure 5A:
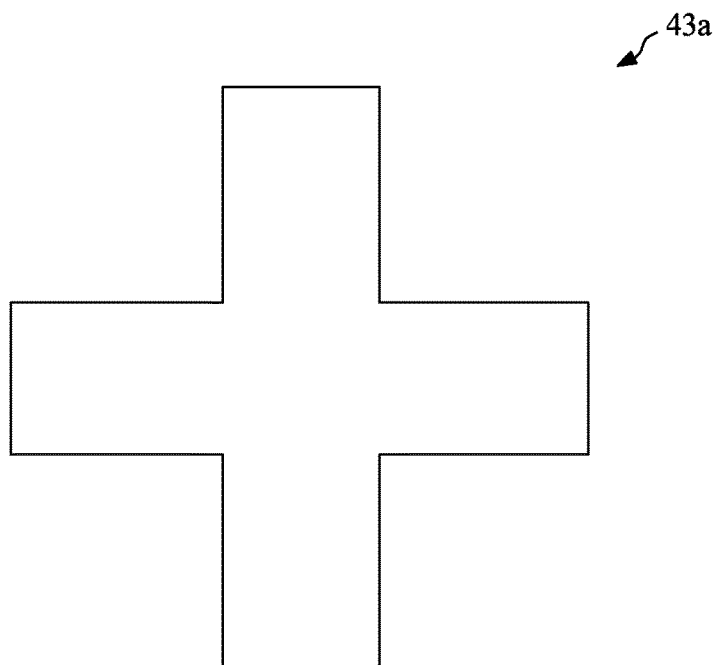
FIG. 5A illustrates a top view of an example of a fiducial mark of an upper conductive structure according to some embodiments of the present disclosure.

FIG. 5A illustrates a top view of an example of a fiducial mark 43a of the upper conductive structure 2b according to some embodiments of the present disclosure. The fiducial mark 43a of the upper conductive structure 2b has a continuous cross shape.

Figure 5B:
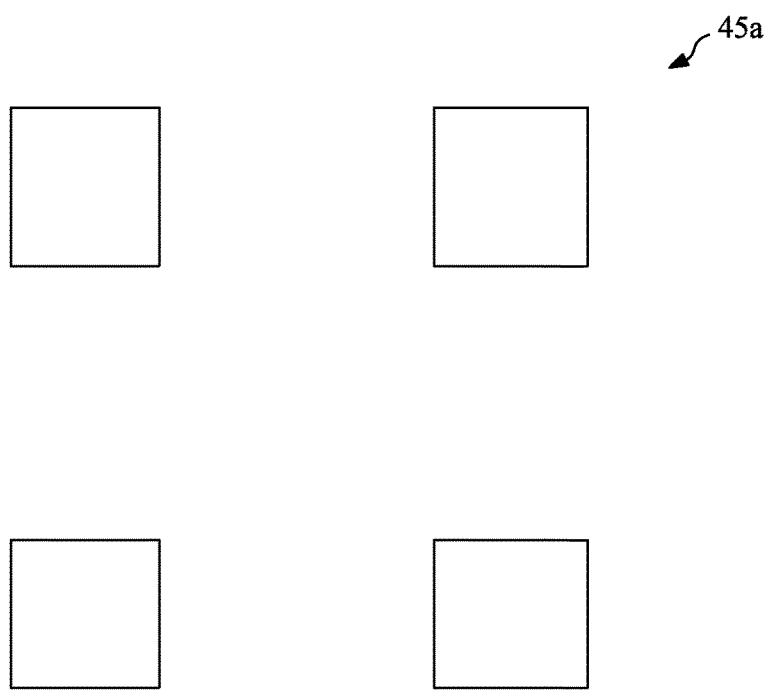
FIG. 5B illustrates a top view of an example of a fiducial mark of a lower conductive structure according to some embodiments of the present disclosure.

FIG. 5B illustrates a top view of an example of a fiducial mark 45a of the lower conductive structure 3b according to some embodiments of the present disclosure. The fiducial mark 45a of the lower conductive structure 3b includes four square-shaped segments spaced apart at four corners.

Figure 5C:
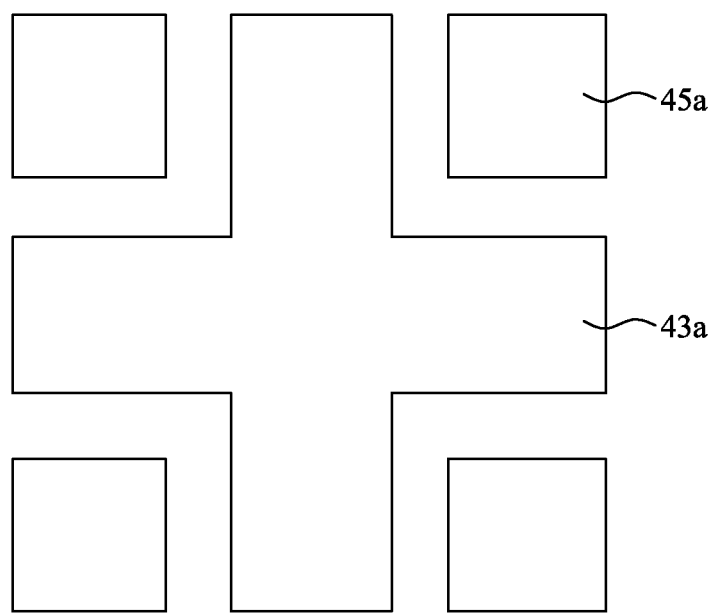
FIG. 5C illustrates a top view of a combination image of the fiducial mark of the upper conductive structure of FIG. 5A and the fiducial mark of the lower conductive structure of FIG. 5B.

FIG. 5C illustrates a top view of a combination image of the fiducial mark 43a of the upper conductive structure 2b of FIG. 5A and the fiducial mark 45a of the lower conductive structure 3b of FIG. 5B. When the upper conductive structure 2b is aligned with the lower conductive structure 3b precisely, the combination image shows the complete fiducial mark 43a and the complete fiducial mark 45a, as shown in FIG. 5C. That is, the fiducial mark 43a does not cover or overlap the fiducial mark 45a from the top view.

Figure 5D:
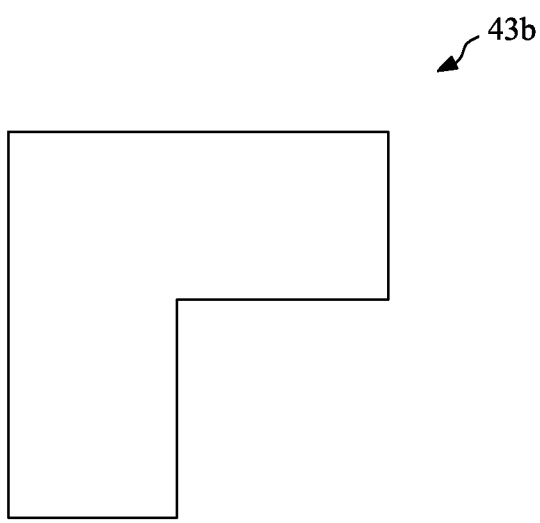
FIG. 5D illustrates a top view of an example of a fiducial mark of an upper conductive structure according to some embodiments of the present disclosure.

FIG. 5D illustrates a top view of an example of a fiducial mark 43b of the upper conductive structure 2b according to some embodiments of the present disclosure. The fiducial mark 43b of the upper conductive structure 2b has a continuous reversed "L" shape.

Figure 5E:
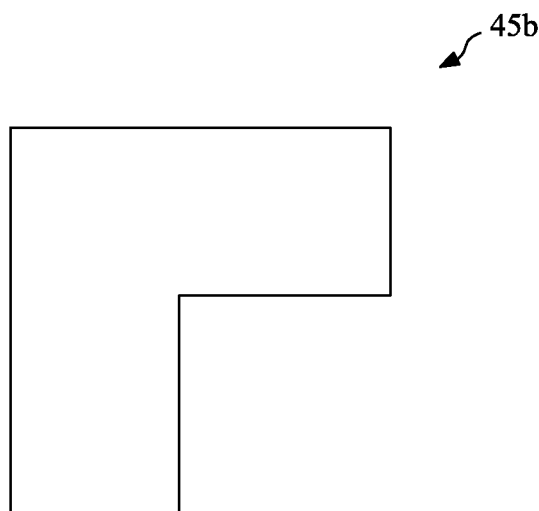
FIG. 5E illustrates a top view of an example of a fiducial mark of a lower conductive structure according to some embodiments of the present disclosure.

FIG. 5E illustrates a top view of an example of a fiducial mark 45b of the lower conductive structure 3b according to some embodiments of the present disclosure. The fiducial mark 45b of the lower conductive structure 3b has a continuous reversed "L" shape which is substantially the same as the fiducial mark 43b of the upper conductive structure 2b.

Figure 5F:
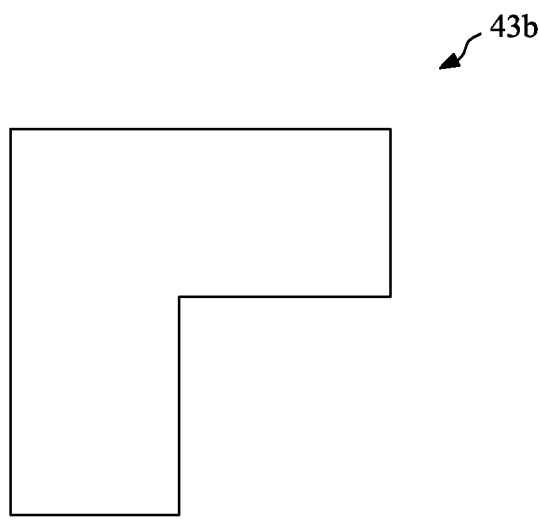
FIG. 5F illustrates a top view of a combination image of the fiducial mark of the upper conductive structure of FIG. 5D and the fiducial mark of the lower conductive structure of FIG. 5E.

FIG. 5F illustrates a top view of a combination image of the fiducial mark 43b of the upper conductive structure 2b of FIG. 5D and the fiducial mark 45b of the lower conductive structure 3b of FIG. 5E. When the upper conductive structure 2b is aligned with the lower conductive structure 3b precisely, the combination image shows solely the fiducial mark 43b of the upper conductive structure 2b, as shown in FIG. 5F. That is, the fiducial mark 43b completely covers or overlaps the fiducial mark 45b from the top view.

Figure 5G:
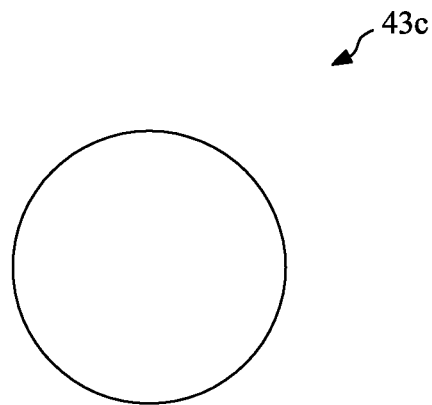
FIG. 5G illustrates a top view of an example of a fiducial mark of an upper conductive structure according to some embodiments of the present disclosure.

FIG. 5G illustrates a top view of an example of a fiducial mark 43c of the upper conductive structure 2b according to some embodiments of the present disclosure. The fiducial mark 43c of the upper conductive structure 2b has a continuous circular shape.

Figure 5H:
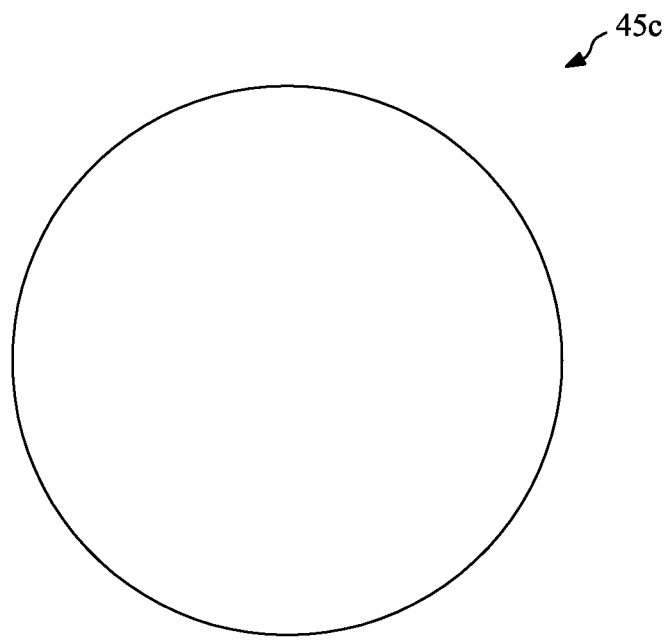
FIG. 5H illustrates a top view of an example of a fiducial mark of a lower conductive structure according to some embodiments of the present disclosure.

FIG. 5H illustrates a top view of an example of a fiducial mark 45c of the lower conductive structure 3b according to some embodiments of the present disclosure. The fiducial mark 45c of the lower conductive structure 3b has a continuous circular shape which is larger than the fiducial mark 43c of the upper conductive structure 2b.

Figure 5I:
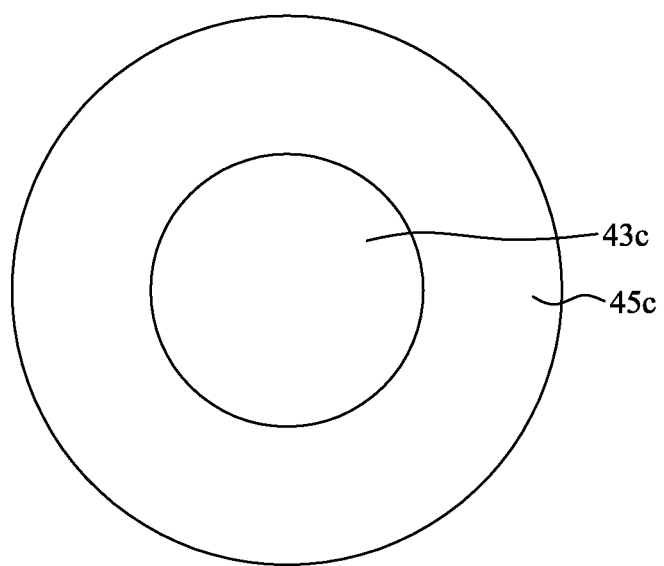
FIG. 5I illustrates a top view of a combination image of the fiducial mark of the upper conductive structure of FIG. 5G and the fiducial mark of the lower conductive structure of FIG. 5H.

FIG. 5I illustrates a top view of a combination image of the fiducial mark 43c of the upper conductive structure 2b of FIG. 5G and the fiducial mark 45c of the lower conductive structure 3b of FIG. 5H. When the upper conductive structure 2b is aligned with the lower conductive structure 3b precisely, the combination image shows two concentric circles, as shown in FIG. 5I. That is, the fiducial mark 43c is disposed at the center of the fiducial mark 45b.

Figure 6:
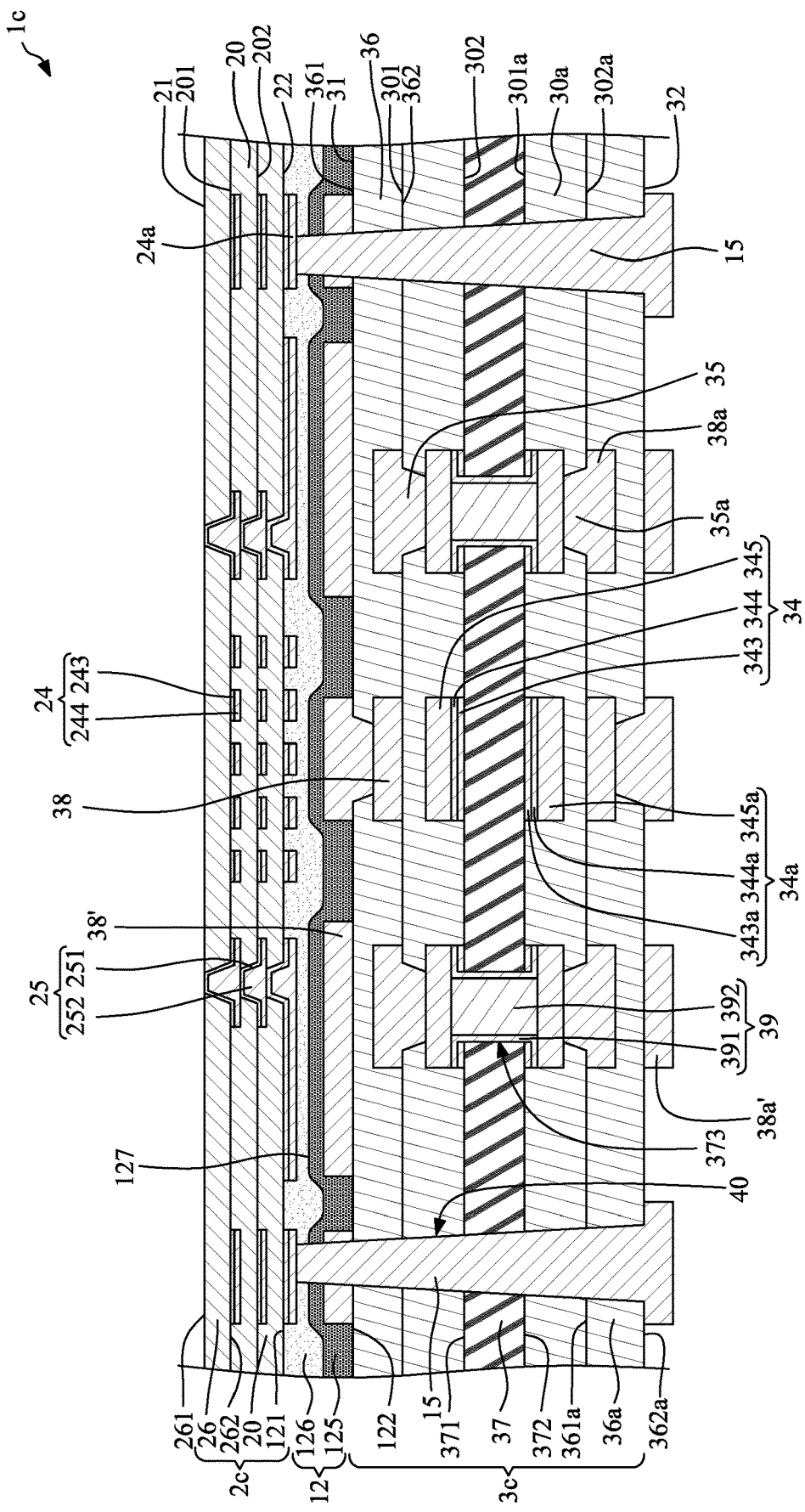
FIG. 6 illustrates a cross-sectional view of a wiring structure according to some embodiments of the present disclosure.

FIG. 6 illustrates a cross-sectional view of a wiring structure 1c according to some embodiments of the present disclosure. The wiring structure 1c is similar to the wiring structure 1 shown in FIG. 1, except for structures of an upper conductive structure 2c and a lower conductive structure 3c. In addition, the upper through via 14 of FIG. 1 is omitted, and at least one lower through via 15 is further included in the wiring structure 1c of FIG. 6. As shown in FIG. 6, the wiring structure 1c defines a through hole 40 extending through the lower conductive structure 3c and the intermediate layer 12. The through hole 40 tapers upwardly. In addition, a thickness of a bottommost first circuit layer 24a of the upper conductive structure 2c is greater than a thickness of the other first circuit layers 24, such as about 1.1 times or greater, about 1.3 times or greater, or about 1.5 times or greater. For example, the thickness of the bottommost first circuit layer 24a may be about 4 and the thickness of the other first circuit layer 24 may be about 3 This is because the bottommost first circuit layer 24a may be used to block a laser beam in a manufacturing process. The bottommost circuit layer 24a (e.g., the bottommost first circuit layer 24a) is disposed on and protrudes from the bottom surface 22 of the upper conductive structure 2c (e.g., the bottom surface 202 of the bottommost first dielectric layer 20).

The lower through via 15 is formed or disposed in the through hole 40. Thus, the lower through via 15 extends through at least a portion of the lower conductive structure 3c and the intermediate layer 12, and is electrically connected to a circuit layer (e.g., the bottommost first circuit layer 24a) of the upper conductive structure 2c. As shown in FIG. 6, the lower through via 15 extends through and contacts the topmost circuit layer (e.g., the second upper circuit layer 38') of the lower conductive structure 3c, and terminates at or on, and contacts a portion of the bottommost circuit layer (e.g., the bottommost first circuit layer 24a) of the upper conductive structure 2c. A length of the lower through via 15 is greater than a thickness of the low-density conductive structure (e.g., the lower conductive structure 3c). Further, the lower through via 15 tapers upwardly. Thus, a tapering direction of the inner via 25 of the upper conductive structure 2c is the same as a tapering direction of the lower through via 15. In some embodiments, the lower through via 15 and the second lower circuit layer 38a' may be formed integrally as a monolithic or one-piece structure.

Figure 7:
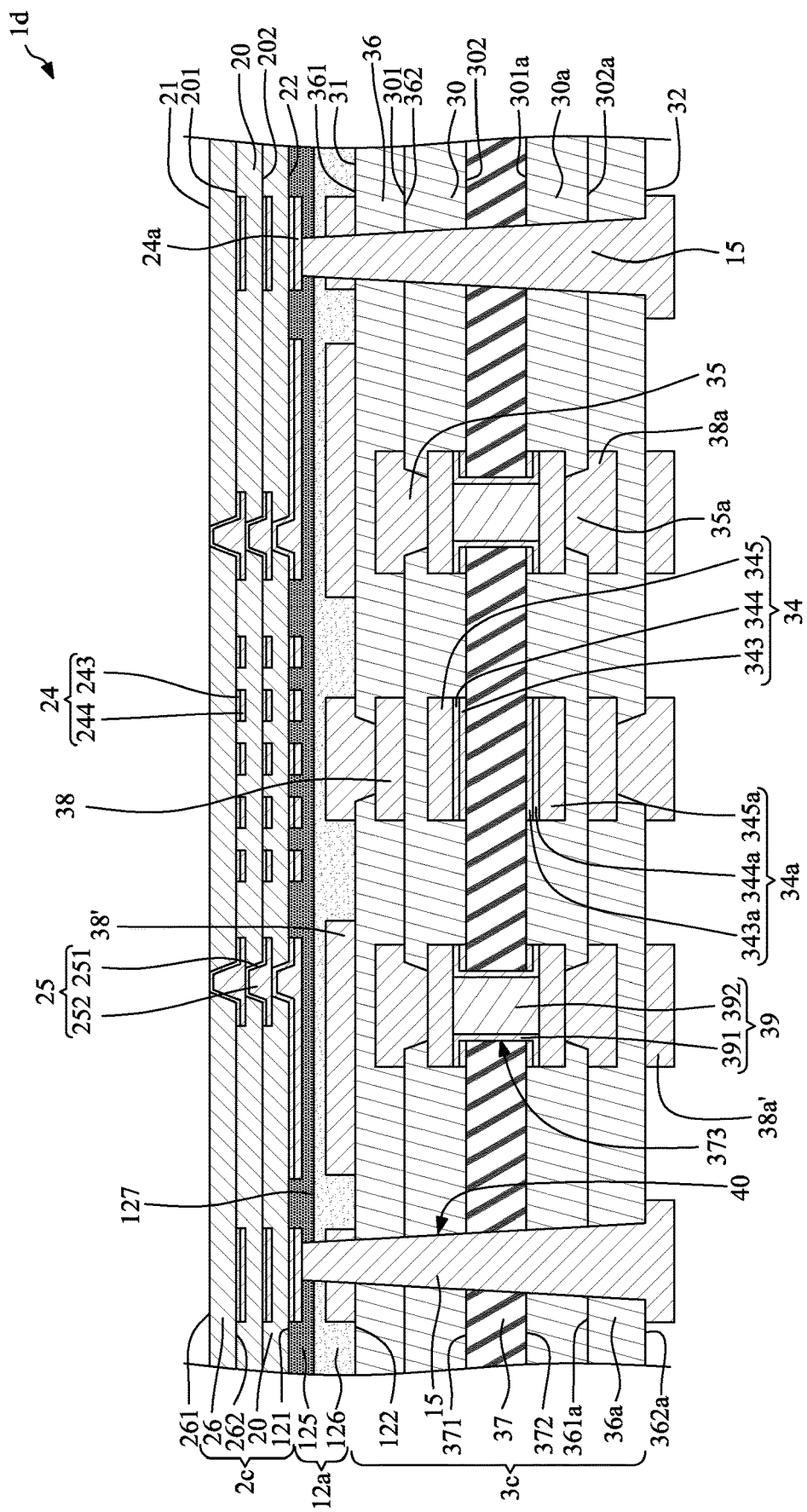
FIG. 7 illustrates a cross-sectional view of a wiring structure according to some embodiments of the present disclosure.

FIG. 7 illustrates a cross-sectional view of a wiring structure 1d according to some embodiments of the present disclosure. The wiring structure 1d is similar to the wiring structure 1c shown in FIG. 6, except for a structure of the intermediate layer 12a. As shown in FIG. 7, the first sub-layer 125 is in contact with the upper conductive structure 2c, and the second sub-layer 126 is in contact with the lower conductive structure 3c and covers a topmost circuit layer (e.g., the second upper circuit layers 38') of the lower conductive structure 3c.

Figure 8:
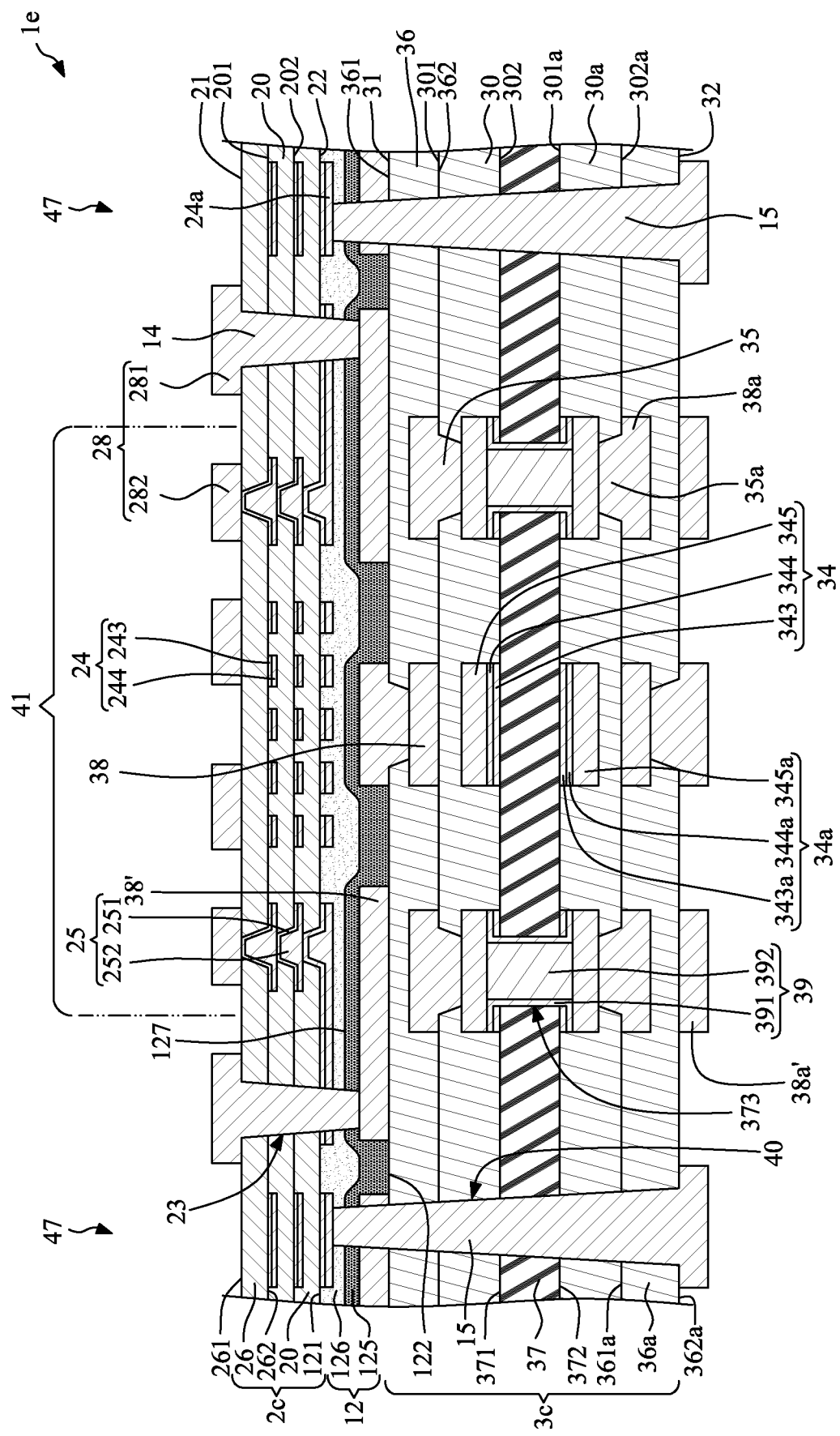
FIG. 8 illustrates a cross-sectional view of a wiring structure according to some embodiments of the present disclosure.

FIG. 8 illustrates a cross-sectional view of a wiring structure 1e according to some embodiments of the present disclosure. The wiring structure 1e is similar to the wiring structure 1 shown in FIG. 1, except for structures of an upper conductive structure 2c and a lower conductive structure 3c. In addition, at least one lower through via 15 is further included in the wiring structure 1e of FIG. 8. The structure of the lower through via 15 of FIG. 8 is similar to the lower through via 15 of FIG. 6. The size of the top portion of the lower through via 15 may be substantially equal to the size of the bottom portion of the upper through via 14, and the tapering direction of the lower through via 15 may be different from the tapering direction of the upper through via 14.

Figure 9:
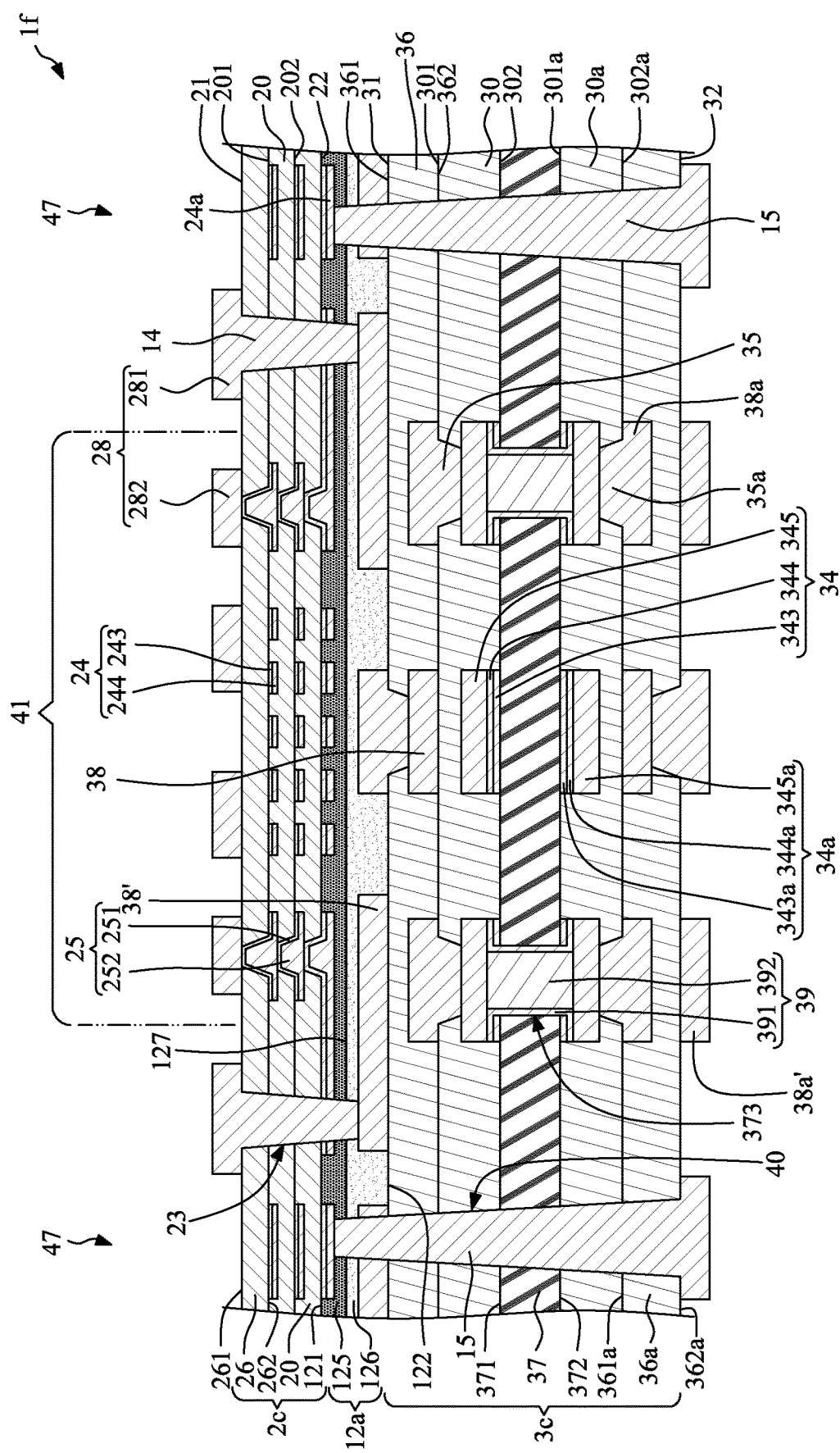
FIG. 9 illustrates a cross-sectional view of a wiring structure according to some embodiments of the present disclosure.

FIG. 9 illustrates a cross-sectional view of a wiring structure 1f according to some embodiments of the present disclosure. The wiring structure 1f is similar to the wiring structure 1e shown in FIG. 6, except for a structure of the intermediate layer 12a. As shown in FIG. 9, the first sub-layer 125 is in contact with the upper conductive structure 2c, and the second sub-layer 126 is in contact with the lower conductive structure 3c and covers a topmost circuit layer (e.g., the second upper circuit layers 38') of the lower conductive structure 3c.

Figure 10:
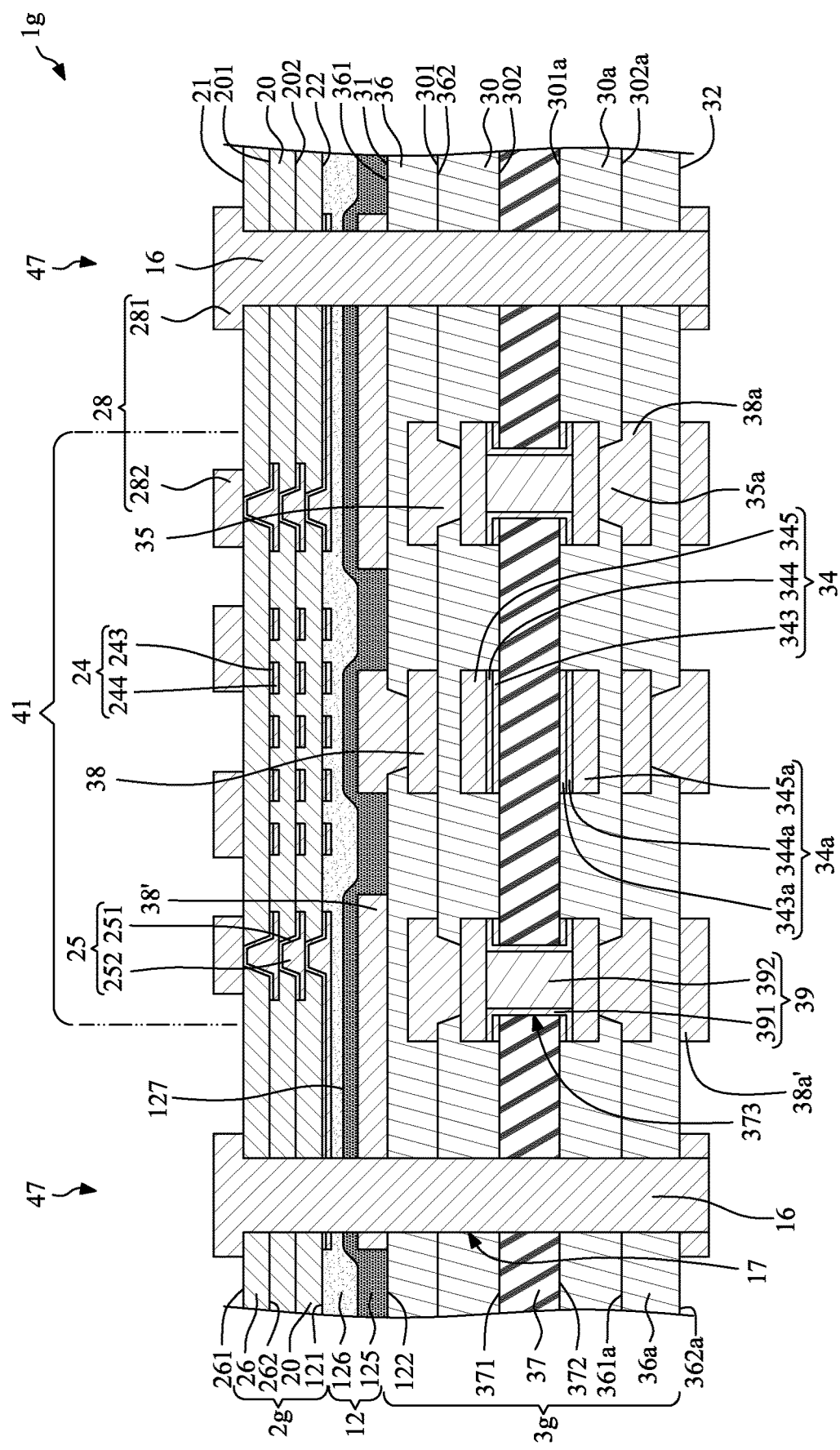
FIG. 10 illustrates a cross-sectional view of a wiring structure according to some embodiments of the present disclosure.

FIG. 10 illustrates a cross-sectional view of a wiring structure 1g according to some embodiments of the present disclosure. The wiring structure 1g is similar to the wiring structure 1 shown in FIG. 1, except for structures of the upper conductive structure 2g and the lower conductive structure 3g. In addition, the upper through via 14 is replaced by at least one penetrating via 16. As shown in FIG. 10, the wiring structure 1g defines at least one through hole 17 extending through the upper conductive structure 2g, the intermediate layer 12 and the lower conductive structure 3g. A maximum width of the through hole 17 may be about 100 µm to about 1000 µm. In some embodiments, the through hole 17 may be formed by mechanical drilling. Thus, the through hole 17 may not taper. The penetrating via 16 is formed or disposed in the corresponding through hole 17, and is formed of a metal, a metal alloy, or other conductive material. Thus, the penetrating via 16 extends through the upper conductive structure 2g, the intermediate layer 12 and the lower conductive structure 3g. As shown in FIG. 10, the penetrating via 16 extends through and contacts the bottommost first circuit layer 24 of the upper conductive structure 2g, the topmost circuit layer (e.g., the second upper circuit layer 38') of the lower conductive structure 3g, and the bottommost circuit layer (e.g., the second lower circuit layer 38a') of the lower conductive structure 3g. In some embodiments, the penetrating via 16 is a monolithic structure or one-piece structure having a homogeneous material composition. In some embodiments, the penetrating via 16 and the second circuit layer 28 may be formed integrally.

Figure 11:
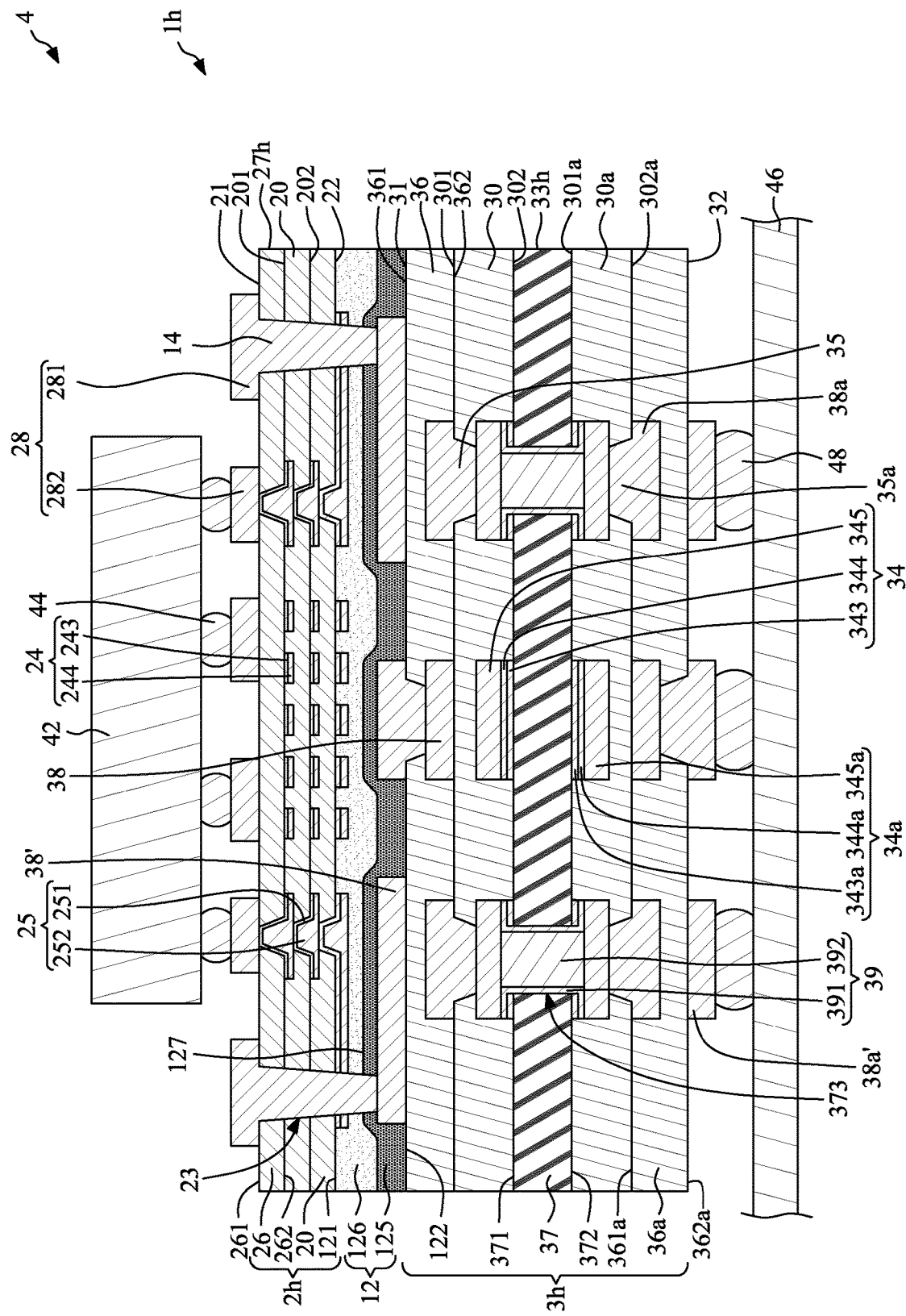
FIG. 11 illustrates a cross-sectional view of a bonding of a package structure and a substrate.

FIG. 11 illustrates a cross-sectional view of a bonding of a package structure 4 and a substrate 46 according to some embodiments. The package structure 4 includes a wiring structure 1h, a semiconductor chip 42, a plurality of first connecting elements 44 and a plurality of second connecting elements 48. The wiring structure 1h of FIG. 11 is similar to the wiring structure 1 shown in FIG. 1, except for structures of an upper conductive structure 2h and a lower conductive structure 3h. The upper conductive structure 2h and the lower conductive structure 3h are both dice and may be singulated concurrently. Thus, the wiring structure 1h is a unit structure. That is, a lateral peripheral surface 27h of the upper conductive structure 2h, a lateral peripheral surface 33h of the lower conductive structure 3h and a lateral peripheral surface of the intermediate layer 12 are substantially coplanar with each other. The semiconductor chip 42 is electrically connected and bonded to the second circuit layer 28 of the upper conductive structure 2h through the first connecting elements 44 (e.g., solder bumps or other conductive bumps). The second lower circuit layer 38a' of the lower conductive structure 3h is electrically connected and bonded to the substrate 46 (e.g., a mother board such as a printed circuit board (PCB)) through the second connecting elements 48 (e.g., solder bumps or other conductive bumps).

Figure 12:
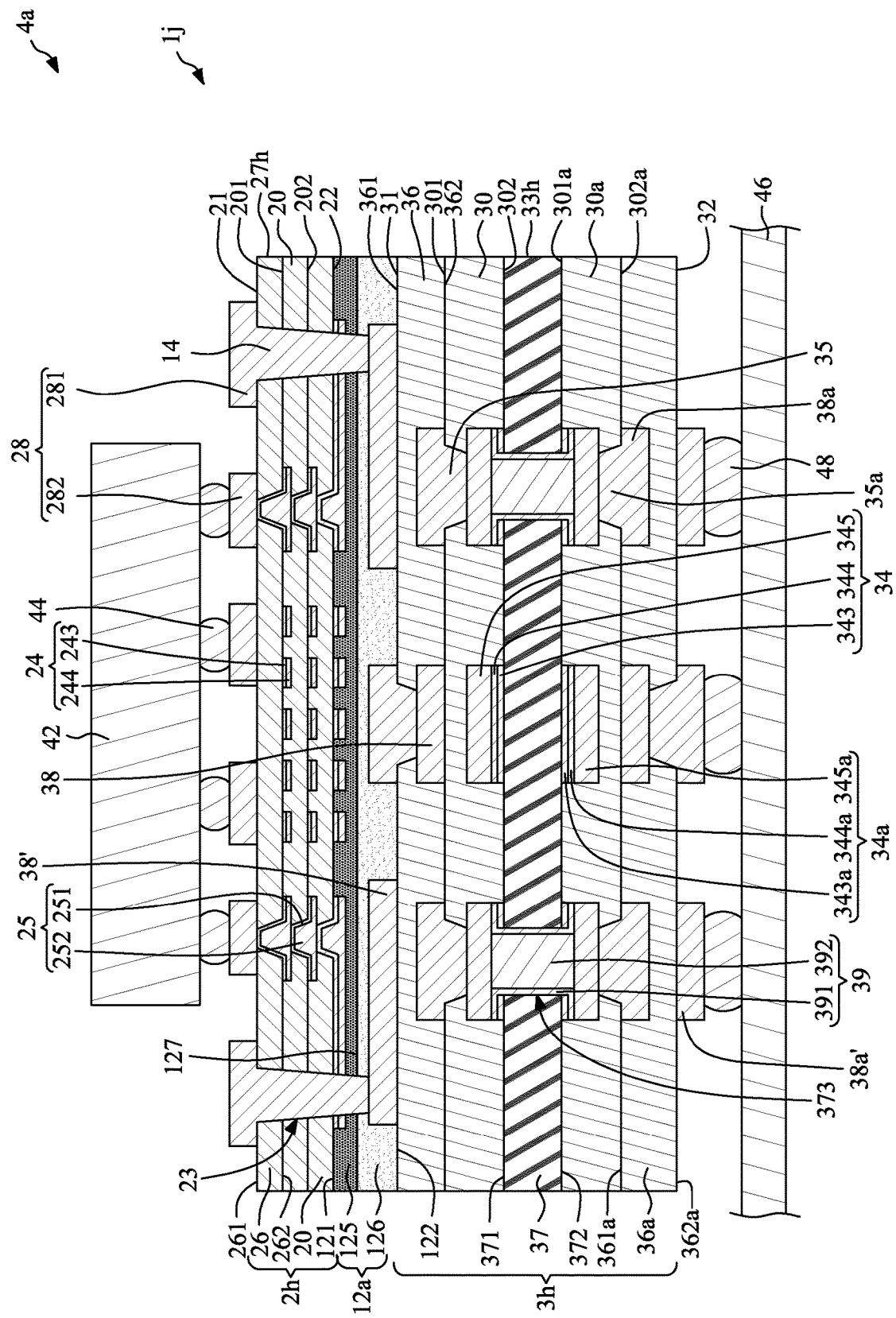
FIG. 12 illustrates a cross-sectional view of a bonding of a package structure and a substrate.

FIG. 12 illustrates a cross-sectional view of a bonding of a package structure 4a and a substrate 46 according to some embodiments. The package structure 4a is similar to the package structure 4 shown in FIG. 11, except for a structure of the intermediate layer 12a. As shown in the wiring structure 1j of FIG. 12, the first sub-layer 125 is in contact with the upper conductive structure 2h, and the second sub-layer 126 is in contact with the lower conductive structure 3h and covers a topmost circuit layer (e.g., the second upper circuit layers 38') of the lower conductive structure 3h.

Figure 13:
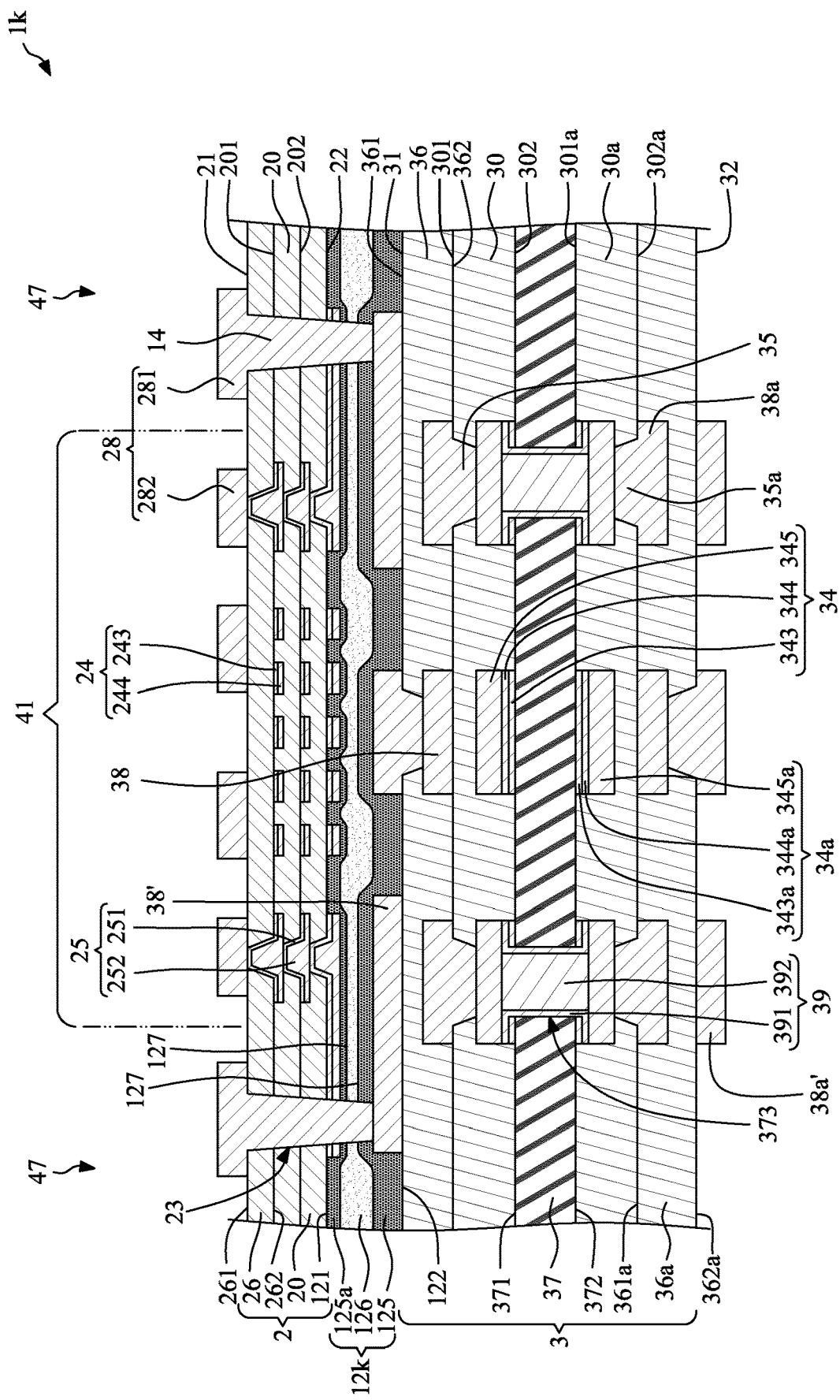
FIG. 13 illustrates a cross-sectional view of a wiring structure according to some embodiments of the present disclosure.

FIG. 13 illustrates a cross-sectional view of a wiring structure 1k according to some embodiments of the present disclosure. The wiring structure 1k is similar to the wiring structure 1 shown in FIG. 1, except for a structure of the intermediate layer 12k. As shown in FIG. 13, a third sub-layer 125a formed from a third polymeric material is interposed between the upper conductive structure 2 and the second sub-layer 126. That is, the intermediate layer 12k includes the first sub-layer 125, the second sub-layer 126 and the third sub-layer 125a. The second sub-layer 126 is interposed between the first sub-layer 125 and the third sub-layer 125a. The viscosity of the first polymeric material is greater than the viscosity of the second polymeric material, and a viscosity of the third polymeric material is greater than the viscosity of the second polymeric material. In some embodiments, the material of the first sub-layer 125 is substantially same as a material of the third sub-layer 125a, and is different from a material of the second sub-layer 126. The viscosity of the first polymeric material is substantially equal to the viscosity of the third polymeric material. As shown in FIG. 13, the first sub-layer 125 is in contact with the lower conductive structure 3 and covers a topmost circuit layer (e.g., the second upper circuit layers 38') of the lower conductive structure 3, and the third sub-layer 125b is in contact with the upper conductive structure 2.

Figure 14:
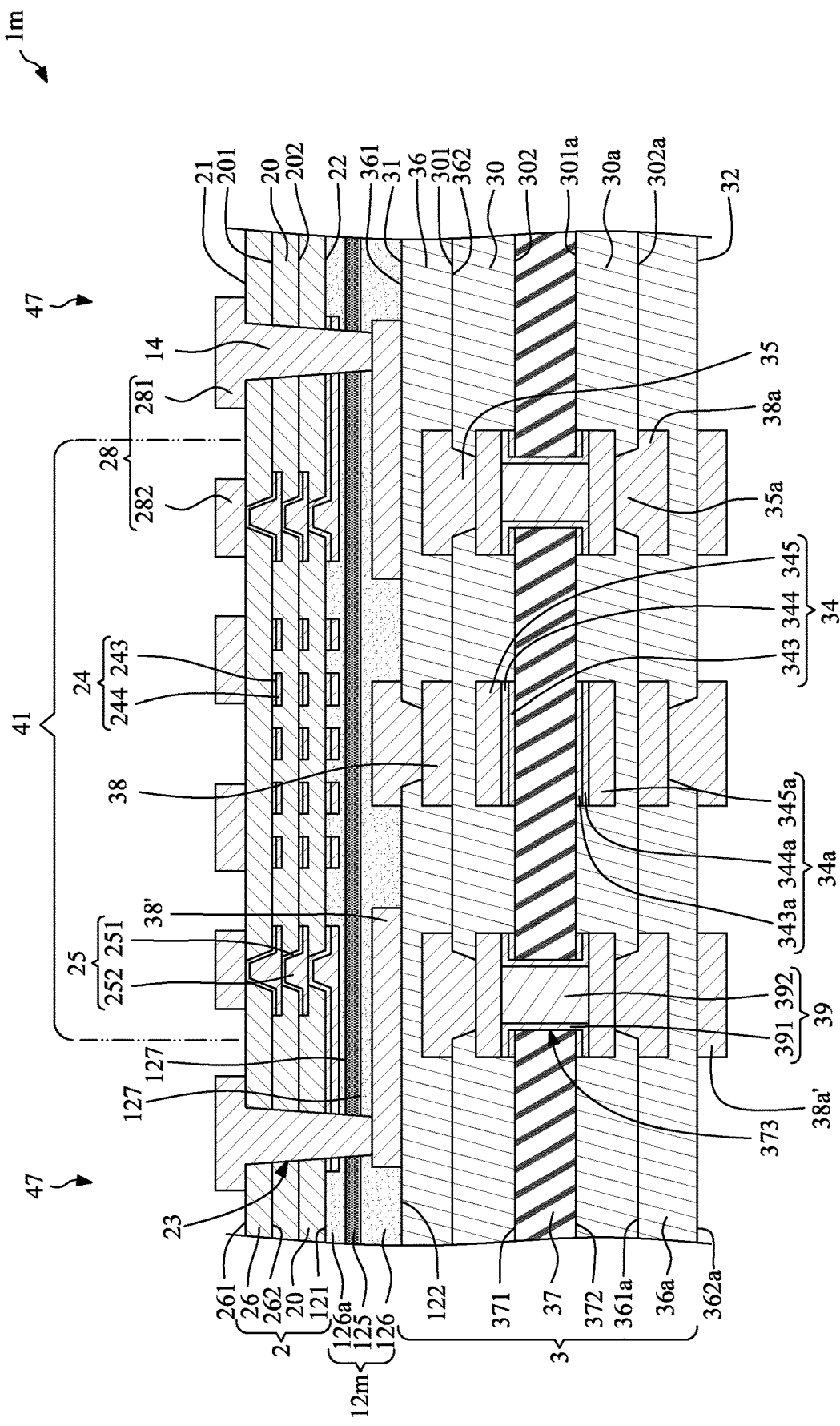
FIG. 14 illustrates a cross-sectional view of a wiring structure according to some embodiments of the present disclosure.

FIG. 14 illustrates a cross-sectional view of a wiring structure 1m according to some embodiments of the present disclosure. The wiring structure 1m is similar to the wiring structure 1a shown in FIG. 4, except for a structure of the intermediate layer 12m. As shown in FIG. 14, a fourth sub-layer 126a formed from a fourth polymeric material is interposed between the upper conductive structure 2 and the first sub-layer 125. That is, the intermediate layer 12m includes the first sub-layer 125, the second sub-layer 126 and the fourth sub-layer 126a. The first sub-layer 125 is interposed between the second sub-layer 126 and the fourth sub-layer 126a. The viscosity of the second polymeric material is less than the viscosity of the first polymeric material, and a viscosity of the fourth polymeric material is less than the viscosity of the first polymeric material. In some embodiments, the material of the second sub-layer 126 is substantially the same as a material of the fourth sub-layer 126a, and is different from a material of the first sub-layer 125. The viscosity of the second polymeric material is substantially equal to the viscosity of the fourth polymeric material. As shown in FIG. 14, the second sub-layer 126 is in contact with the lower conductive structure 3 and covers a topmost circuit layer (e.g., the second upper circuit layers 38') of the lower conductive structure 3, and the fourth sub-layer 126a is in contact with the upper conductive structure 2.

Figure 15:
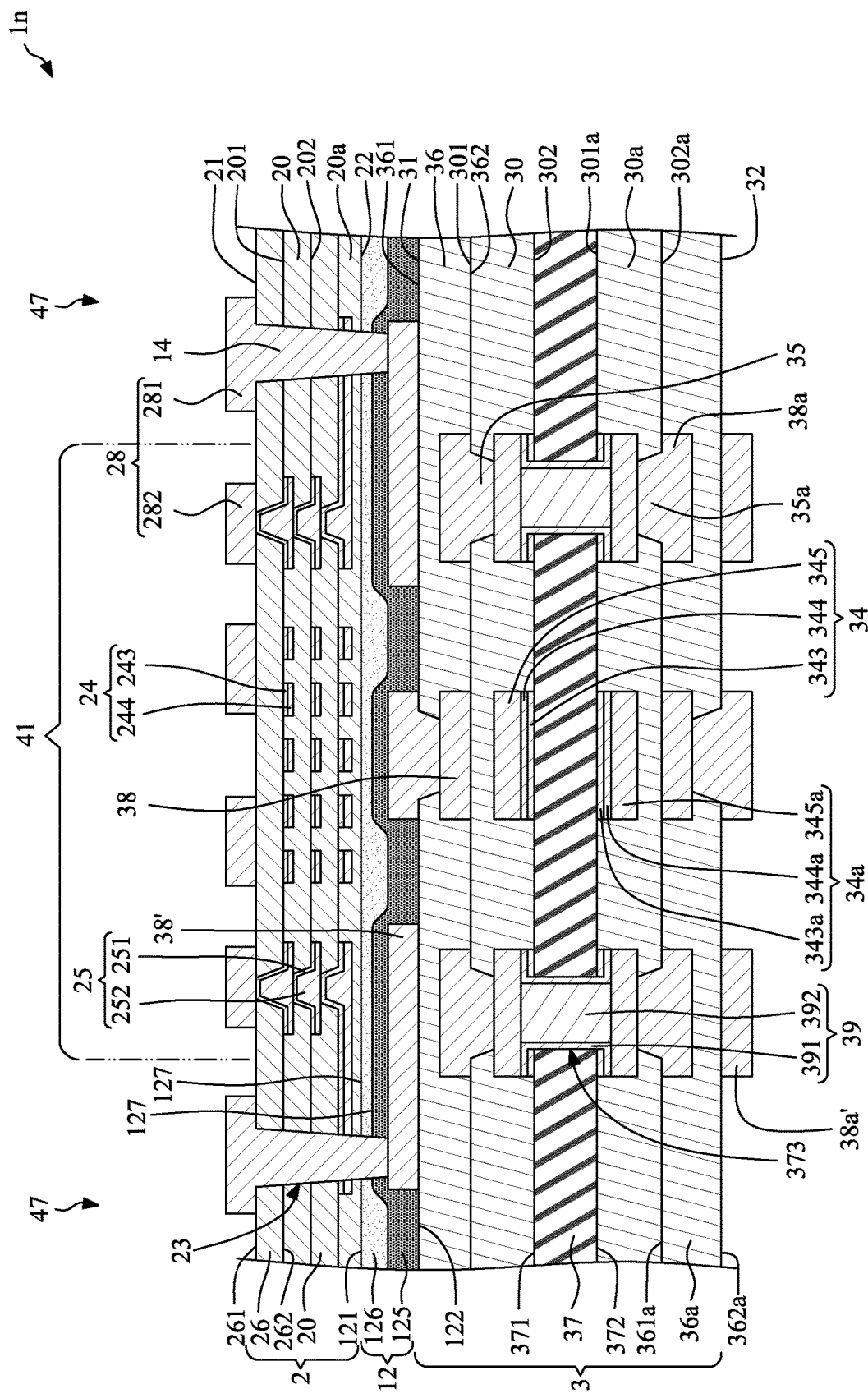
FIG. 15 illustrates a cross-sectional view of a wiring structure according to some embodiments of the present disclosure.

FIG. 15 illustrates a cross-sectional view of a wiring structure 1n according to some embodiments of the present disclosure. The wiring structure 1n is similar to the wiring structure 1 shown in FIG. 1, except for a structure of the upper conductive structure 2n. As shown in FIG. 15, the upper conductive structure 2n further includes a bottommost first dielectric layer 20a that covers the bottommost first circuit layer 24. Thus, the entire bottom surface 22 of the upper conductive structure 2 (e.g., the bottom surface 202 of the bottommost first dielectric layer 20a) is substantially flat. The second sub-layer 126 of the intermediate layer 12 adheres to the bottom surface 22 of the upper conductive structure 2n (e.g., the bottom surface 202 of the bottommost first dielectric layer 20a). Thus, the entire top surface 121 of the intermediate layer 12 is substantially flat. The second sub-layer 126 of the intermediate layer 12 does not include or contact a horizontally extending or connecting circuit layer. That is, there is no horizontally extending or connecting circuit layer disposed or embedded in the second sub-layer 126 of the intermediate layer 12.

Figure 16:
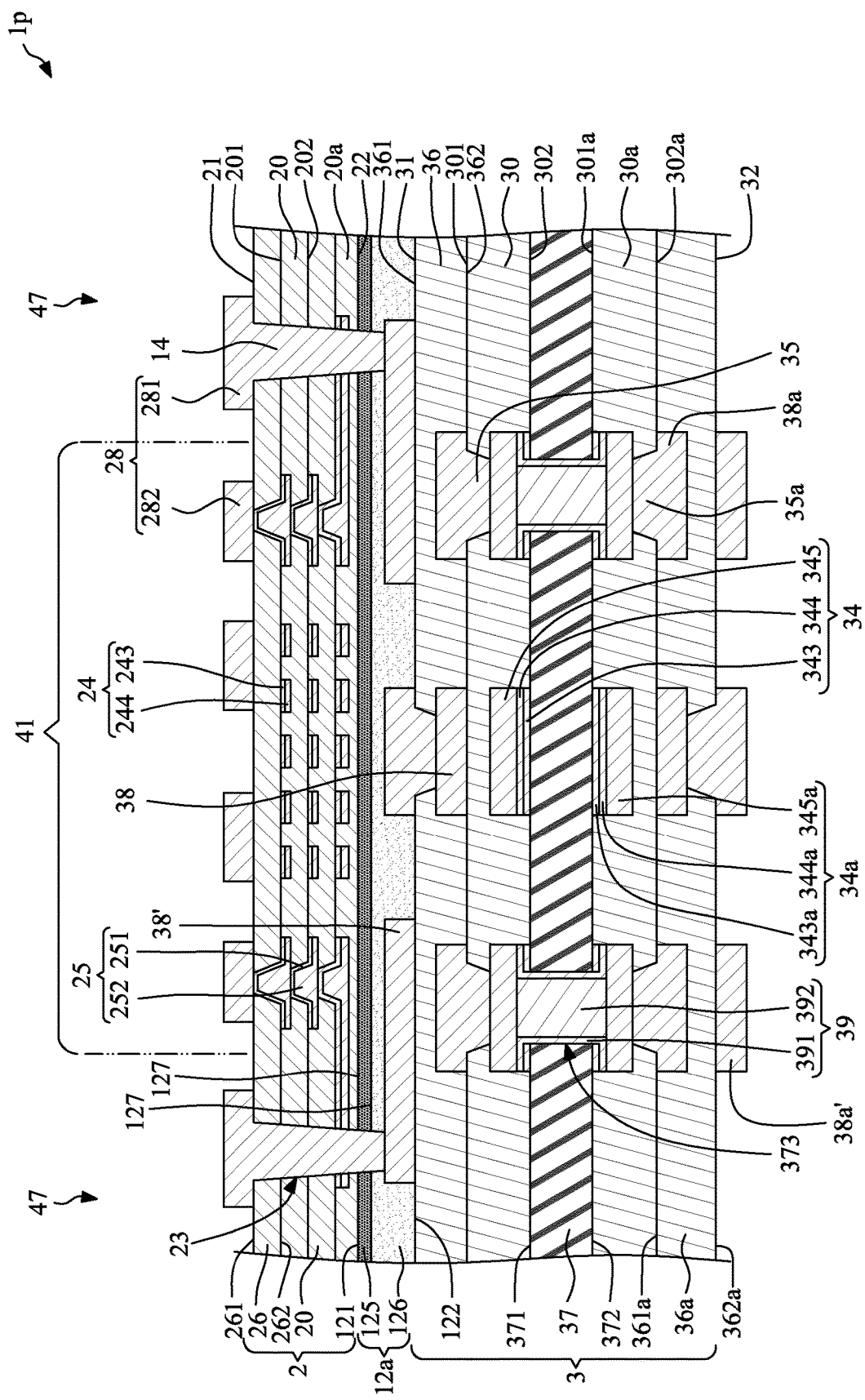
FIG. 16 illustrates a cross-sectional view of a wiring structure according to some embodiments of the present disclosure.

FIG. 16 illustrates a cross-sectional view of a wiring structure 1p according to some embodiments of the present disclosure. The wiring structure 1p is similar to the wiring structure 1n shown in FIG. 15, except for a structure of the intermediate layer 12a. As shown in FIG. 16, the first sub-layer 125 is in contact with the bottom surface 22 of the upper conductive structure 2n (e.g., the bottom surface 202 of the bottommost first dielectric layer 20a). The second sub-layer 126 is in contact with the lower conductive structure 3 and covers a topmost circuit layer (e.g., the second upper circuit layers 38') of the lower conductive structure 3.

FIG. 17 through FIG. 41 illustrate a method for manufacturing a wiring structure according to some embodiments of the present disclosure. In some embodiments, the method is for manufacturing the wiring structure 1 shown in FIG. 1 and/or the package structure 4 shown in FIG. 11.

Figure 17:
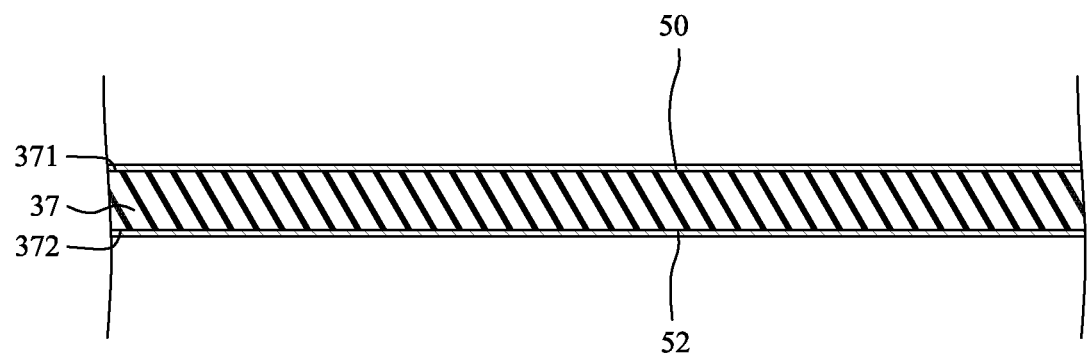
FIG. 17 illustrates one or more stages of an example of a method for manufacturing a wiring structure according to some embodiments of the present disclosure.

Referring to FIG. 17 through FIG. 26, a lower conductive structure 3 is provided. The lower conductive structure 3 is manufactured as follows. Referring to FIG. 17, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 18:
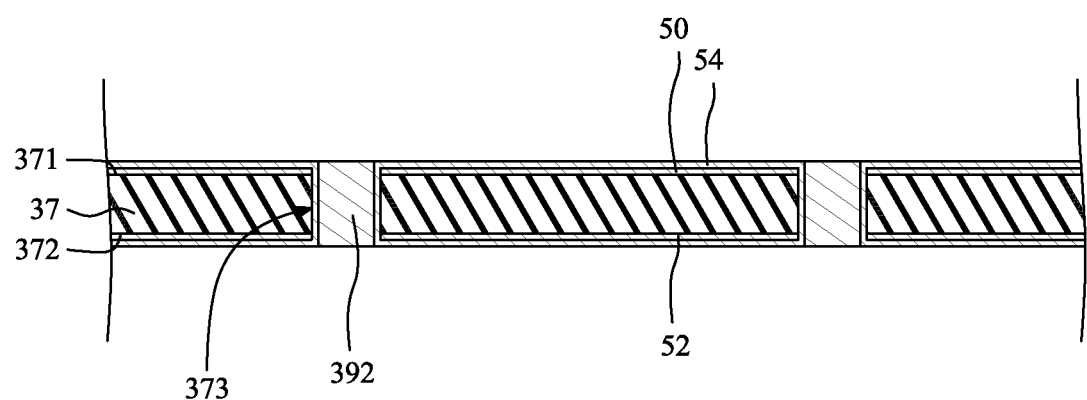
FIG. 18 illustrates one or more stages of an example of a method for manufacturing a wiring structure according to some embodiments of the present disclosure.

Referring to FIG. 18, a plurality of through holes 373 are formed to extend through the core portion 37, the top copper foil 50 and the bottom copper foil 52 by a drilling technique (such as laser drilling or mechanical drilling) or other suitable techniques.

Then, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Then, an insulation material 392 is disposed to fill the central through hole defined by the second metallic layer 54.

Figure 19:
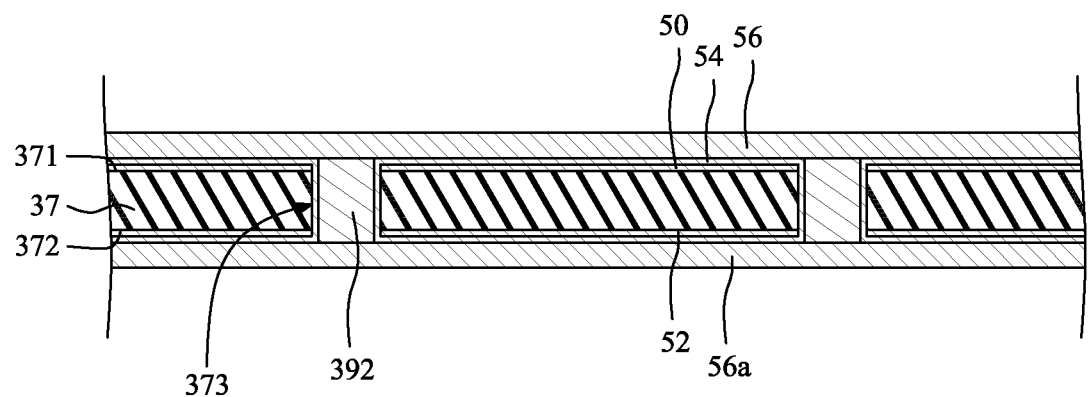
FIG. 19 illustrates one or more stages of an example of a method for manufacturing a wiring structure according to some embodiments of the present disclosure.

Referring to FIG. 19, a top third metallic layer 56 and a bottom third metallic layer 56a are formed or disposed on the second metallic layer 54 by a plating technique or other suitable techniques. The third metallic layers 56, 56a cover the insulation material 392.

Figure 20:
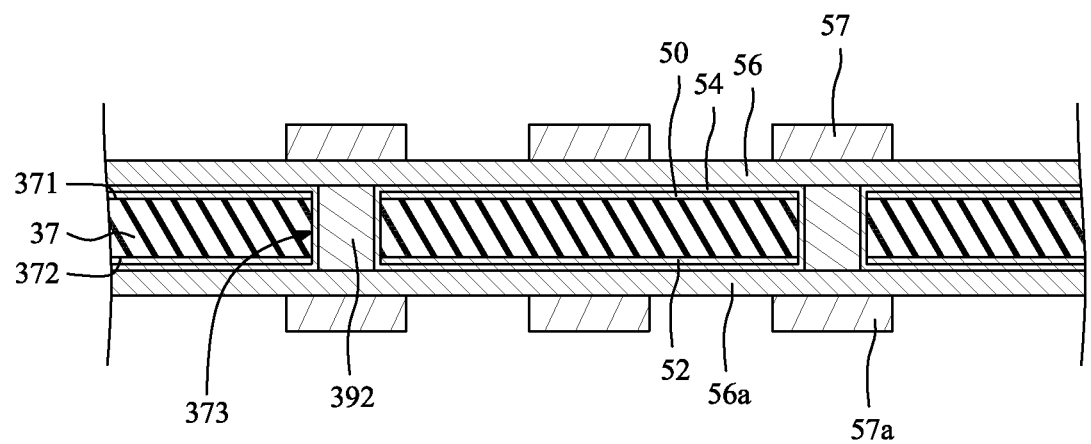
FIG. 20 illustrates one or more stages of an example of a method for manufacturing a wiring structure according to some embodiments of the present disclosure.

Referring to FIG. 20, a top photoresist layer 57 is formed or disposed on the top third metallic layer 56, and a bottom photoresist layer 57a is formed or disposed on the bottom third metallic layer 56*a*. Then, the photoresist layers 57, 57*a* are patterned by exposure and development.

Figure 21:
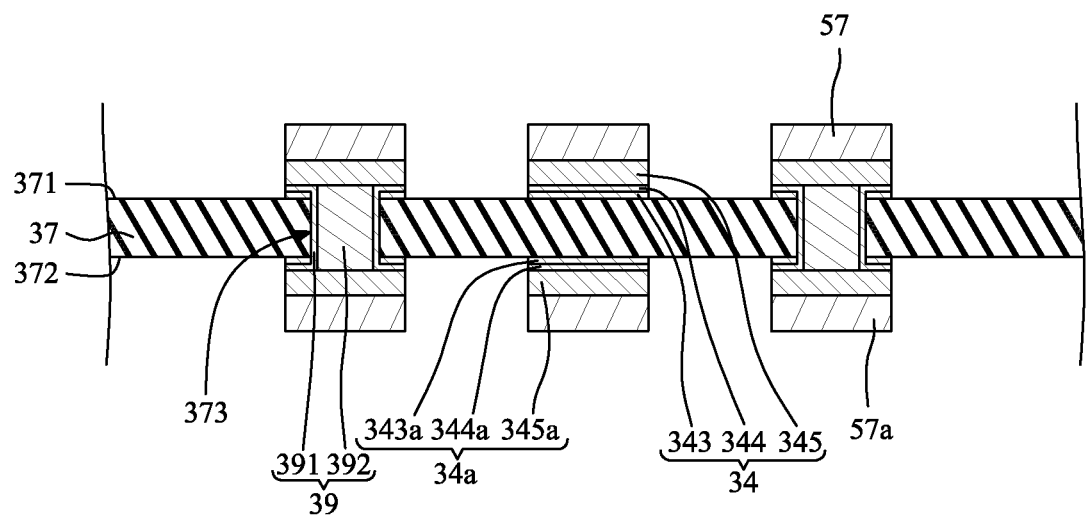
FIG. 21 illustrates one or more stages of an example of a method for manufacturing a wiring structure according to some embodiments of the present disclosure.

Referring to FIG. 21, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56*a* that are not covered by the bottom photoresist layer 57*a* are removed by an etching technique or other suitable techniques. Portions of the bottom copper foil 52, the second metallic layer 54 and the bottom third metallic layer 56*a* that are covered by the bottom photoresist layer 57*a* remain to form a first lower circuit layer 34*a*. Meanwhile, portions of the second metallic layer 54 and the insulation material 392 that are disposed in the through hole 373 form an interconnection via 39.

Figure 22:
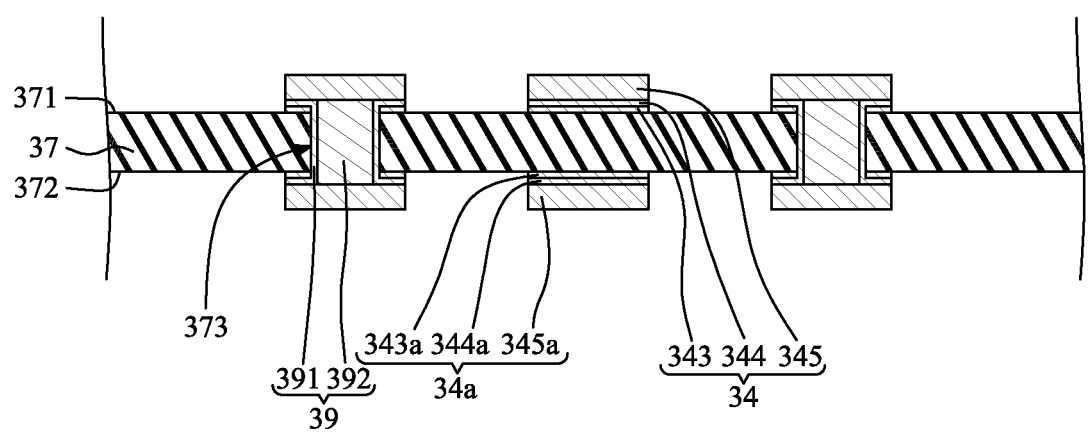
FIG. 22 illustrates one or more stages of an example of a method for manufacturing a wiring structure according to some embodiments of the present disclosure.

Referring to FIG. 22, the top photoresist layer 57 and the bottom photoresist layer 57*a* are removed by a stripping technique or other suitable techniques.

Figure 23:
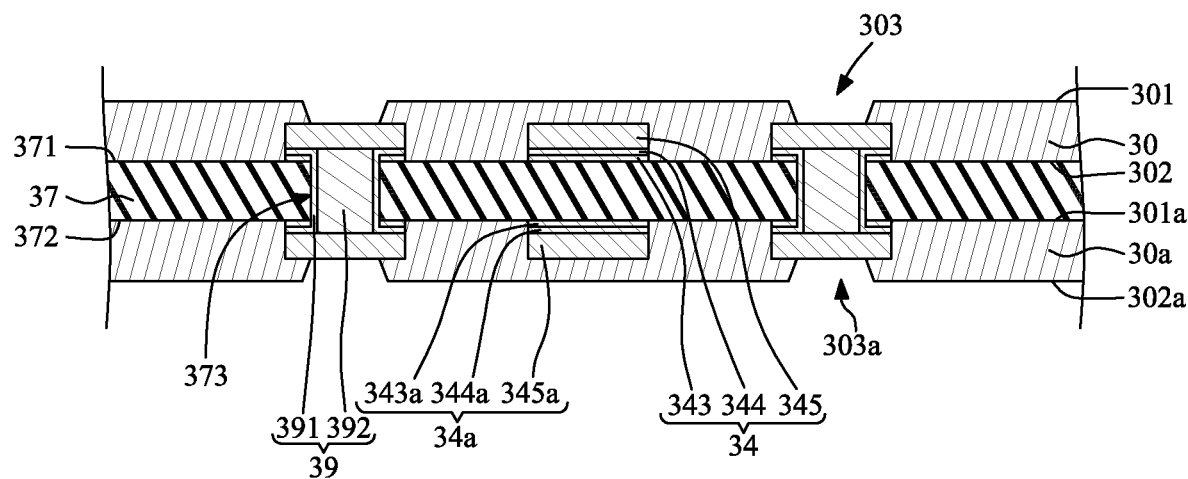
FIG. 23 illustrates one or more stages of an example of a method for manufacturing a wiring structure according to some embodiments of the present disclosure.

Referring to FIG. 23, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30*a* is formed or disposed on the bottom surface 372 of the core portion 37 to cover the bottom surface 372 of the core portion 37 and the first lower circuit layer 34*a* by a lamination technique or other suitable techniques. Then, at least one through hole 303 is formed to extend through the first upper dielectric layer 30 to expose a portion of the first upper circuit layer 34 by a drilling technique or other suitable techniques. Meanwhile, at least one through hole 303*a* is formed to extend through the first lower dielectric layer 30*a* to expose a portion of the first lower circuit layer 34*a* by a drilling technique or other suitable techniques.

Figure 24:
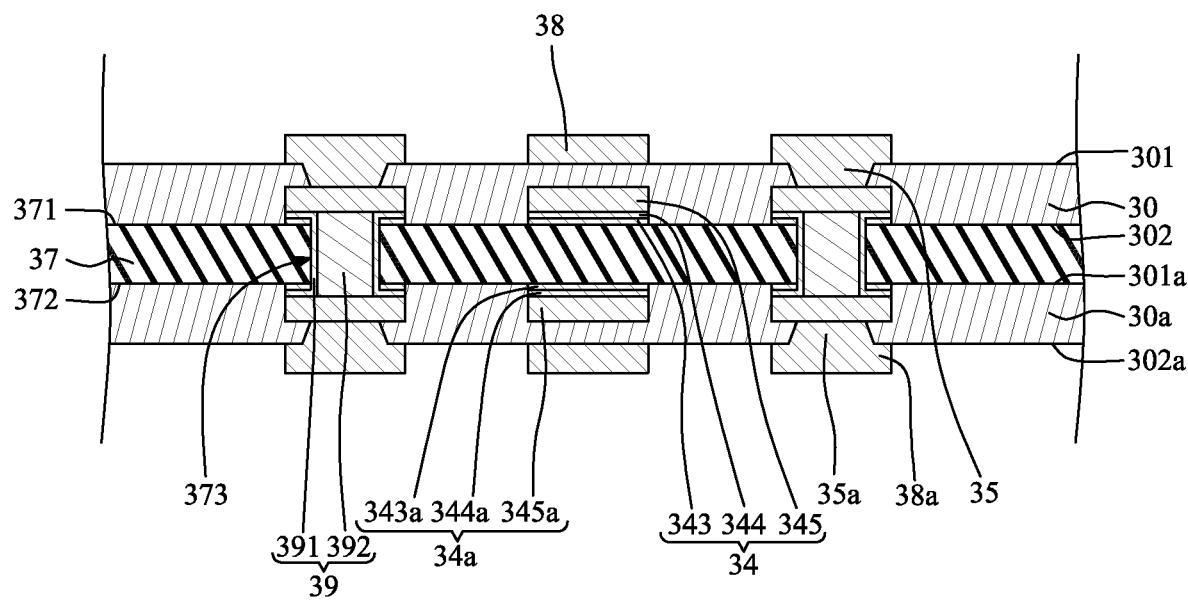
FIG. 24 illustrates one or more stages of an example of a method for manufacturing a wiring structure according to some embodiments of the present disclosure.

Referring to FIG. 24, a second upper circuit layer 38 is formed on the first upper dielectric layer 30, and an upper interconnection via 35 is formed in the through hole 303. Meanwhile, a second lower circuit layer 38*a* is formed on the first lower dielectric layer 30*a*, and a lower interconnection via 35*a* is formed in the through hole 303*a*.

Figure 25:
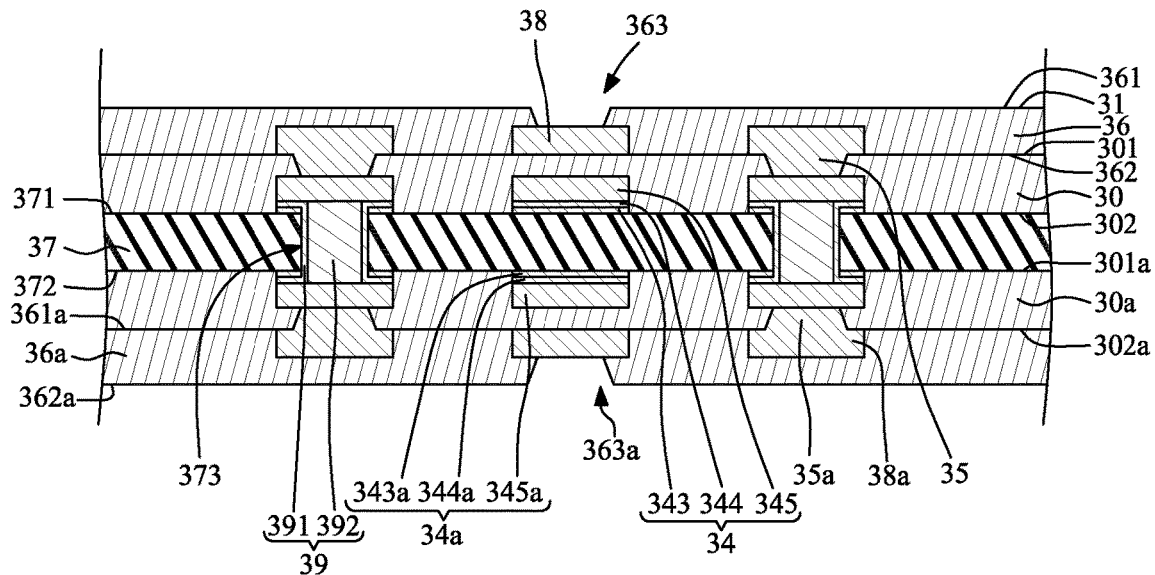
FIG. 25 illustrates one or more stages of an example of a method for manufacturing a wiring structure according to some embodiments of the present disclosure.

Referring to FIG. 25, a second upper dielectric layer 36 is formed or disposed on the top surface 301 of the first upper dielectric layer 30 to cover the top surface 301 of the first upper dielectric layer 30 and the second upper circuit layer 38 by a lamination technique or other suitable techniques. Meanwhile, a second lower dielectric layer 36*a* is formed or disposed on the bottom surface 302*a* of the first lower dielectric layer 30*a* to cover the bottom surface 302*a* of the first lower dielectric layer 30*a* and the second lower circuit layer 38*a* by a lamination technique or other suitable techniques. Then, at least one through hole 363 is formed to extend through the second upper dielectric layer 36 to expose a portion of the second upper circuit layer 38 by a drilling technique or other suitable techniques. Meanwhile, at least one through hole 363*a* is formed to extend through the second lower dielectric layer 36*a* to expose a portion of the second lower circuit layer 38*a* by a drilling technique or other suitable techniques.

Figure 26:
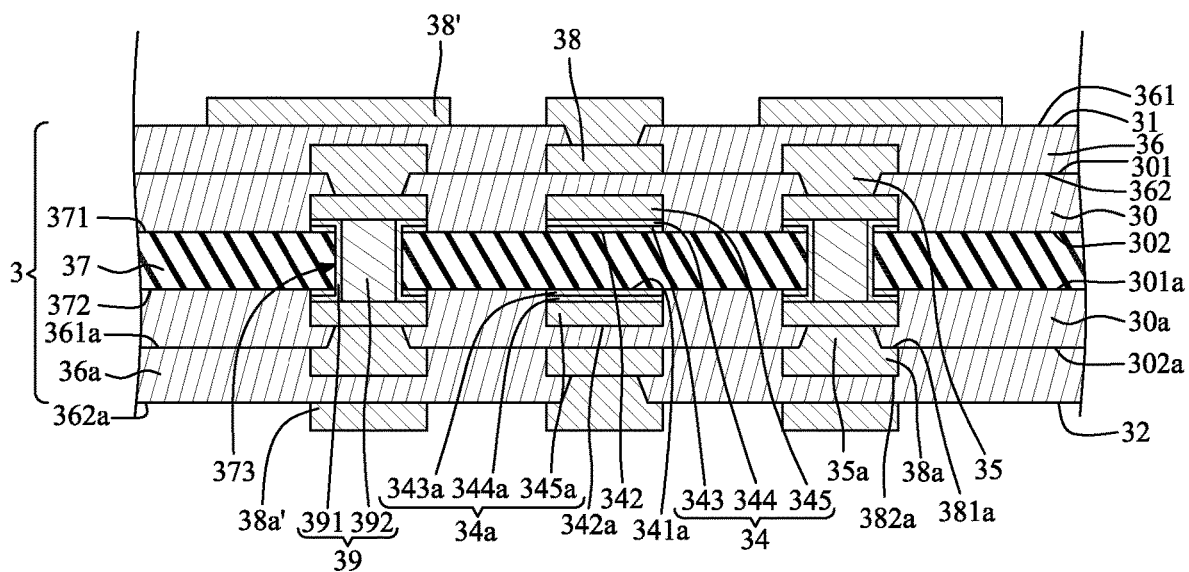
FIG. 26 illustrates one or more stages of an example of a method for manufacturing a wiring structure according to some embodiments of the present disclosure.

Referring to FIG. 26, a second upper circuit layer 38' is formed on the second upper dielectric layer 36, and an upper interconnection via 35 is formed in the through hole 363. Meanwhile, a second lower circuit layer 38*a*' is formed on the second lower dielectric layer 36*a*, and a lower interconnection via 35*a* is formed in the through hole 363*a*.

Meanwhile, the lower conductive structure 3 is formed, and the dielectric layers (including, the first upper dielectric layer 30, the second upper dielectric layer 36, the first lower dielectric layer 30*a* and the second lower dielectric layer 36*a*) are cured. The lower conductive structure 3 may be a wafer structure, a strip structure or a panel structure. Then, an electrical property (such as open circuit/short circuit) of the lower conductive structure 3 is tested.

Figure 27:
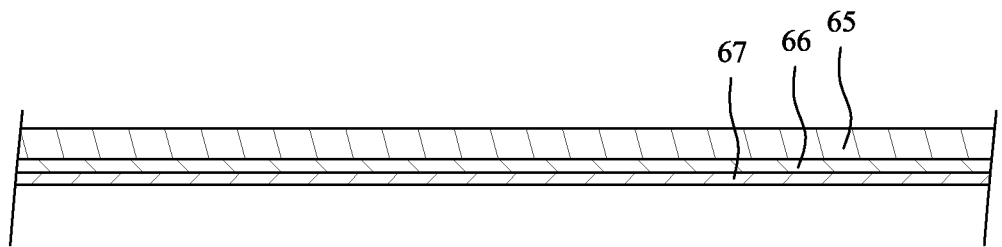
FIG. 27 illustrates one or more stages of an example of a method for manufacturing a wiring structure according to some embodiments of the present disclosure.

Referring to FIG. 27 through FIG. 33, an upper conductive structure 2 is provided. The upper conductive structure 2 is manufactured as follows. Referring to FIG. 27, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a physical vapor deposition (PVD) technique or other suitable techniques.

Figure 28:
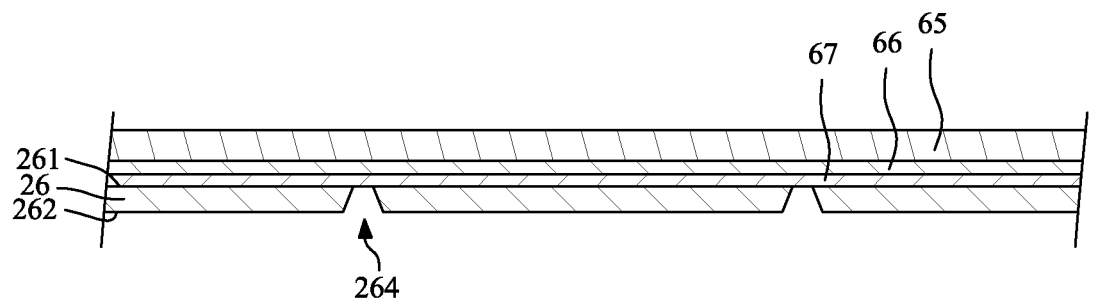
FIG. 28 illustrates one or more stages of an example of a method for manufacturing a wiring structure according to some embodiments of the present disclosure.

Referring to FIG. 28, a second dielectric layer 26 is formed on the conductive layer 67 by a coating technique or other suitable techniques. Then, at least one through hole 264 is formed to extend through the second dielectric layer 26 to expose a portion of the conductive layer 67 by an exposure and development technique or other suitable techniques.

Figure 29:
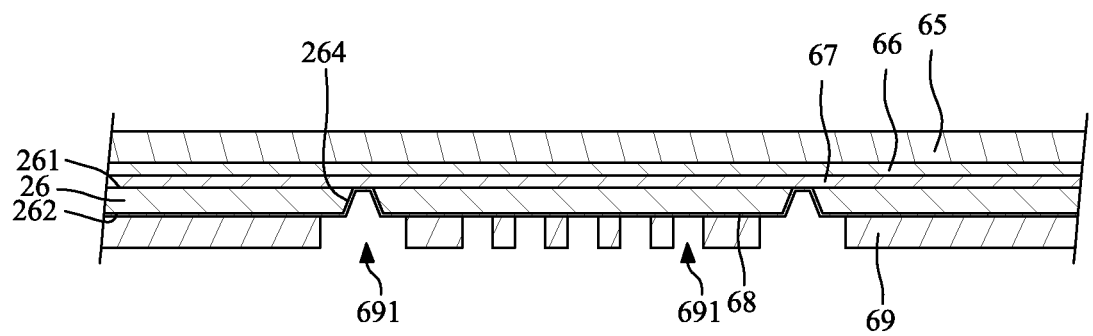
FIG. 29 illustrates one or more stages of an example of a method for manufacturing wiring structure according to some embodiments of the present disclosure.

Referring to FIG. 29, a seed layer 68 is formed on a bottom surface 262 of the second dielectric layer 26 and in the through hole 264 by a PVD technique or other suitable techniques. Then, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 30:
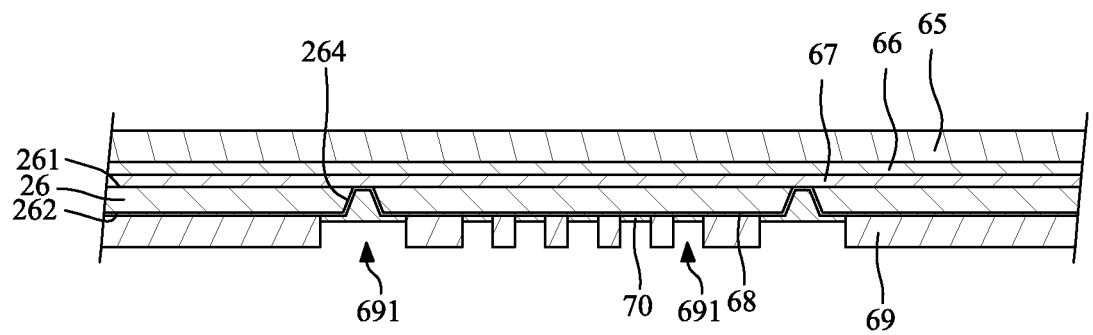
FIG. 30 illustrates one or more stages of an example of a method for manufacturing a wiring structure according to some embodiments of the present disclosure.

Referring to FIG. 30, a conductive material 70 (e.g., a metallic material) is disposed in the openings 691 of the photoresist layer 69 and on the seed layer 68 by a plating technique or other suitable techniques.

Figure 31:
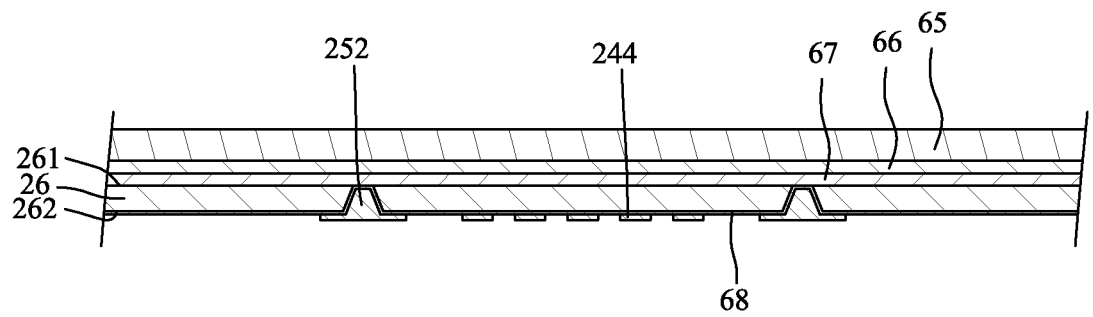
FIG. 31 illustrates one or more stages of an example of a method for manufacturing a wiring structure according to some embodiments of the present disclosure.

Referring to FIG. 31, the photoresist layer 69 is removed by a stripping technique or other suitable techniques.

Figure 32:
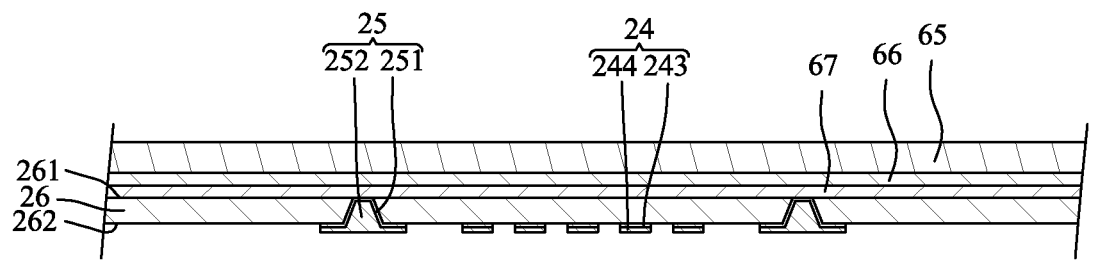
FIG. 32 illustrates one or more stages of an example of a method for manufacturing a wiring structure according to some embodiments of the present disclosure.

Referring to FIG. 32, portions of the seed layer 68 that are not covered by the conductive material 70 are removed by an etching technique or other suitable techniques. Meanwhile, a circuit layer 24 and at least one inner via 25 are formed.

Figure 33:
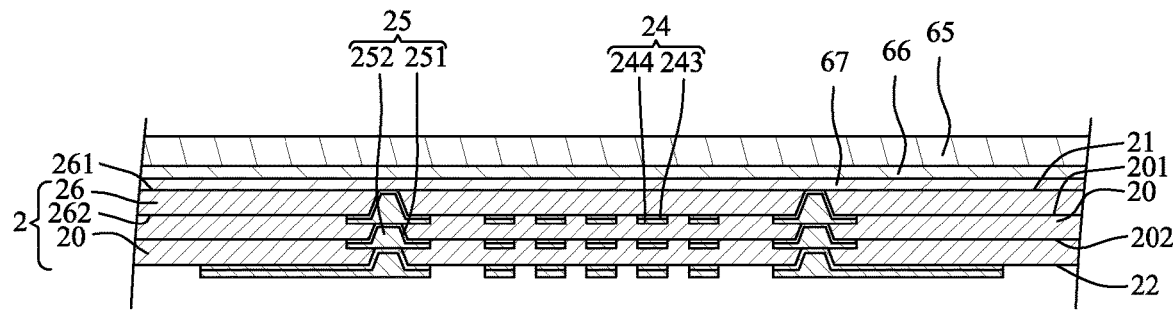
FIG. 33 illustrates one or more stages of an example of a method for manufacturing a wiring structure according to some embodiments of the present disclosure.

Referring to FIG. 33, a plurality of first dielectric layers 20 and a plurality of first circuit layers 24 are formed by repeating the stages of FIG. 28 to FIG. 32. Meanwhile, the upper conductive structure 2 is formed, and the dielectric layers (including, the first dielectric layers 20 and the second dielectric layer 26) are cured. Then, an electrical property (such as open circuit/short circuit) of the upper conductive structure 2 is tested.

Figure 34:
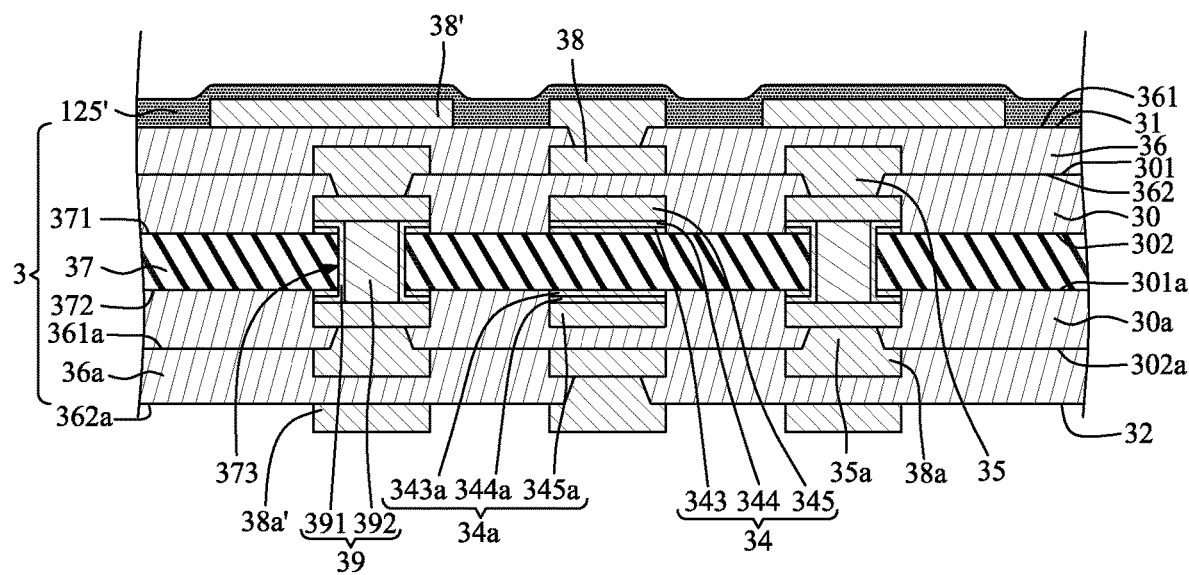
FIG. 34 illustrates one or more stages of an example of a method for manufacturing a wiring structure according to some embodiments of the present disclosure.

Referring to FIG. 34, a first polymeric material 125' is formed or applied on the top surface 31 of the lower conductive structure 3 covers a topmost circuit layer (e.g., the second upper circuit layer 38') of the lower conductive structure 3. The top surface of the first polymeric material 125' is substantially conformal with the top surface 31 and the second upper circuit layer 38' of the lower conductive structure 3 due to a relative high viscosity and a less thickness of the first polymeric material 125'. Thus, the top surface of the first polymeric material 125' is not a smooth flat surface.

Figure 35:
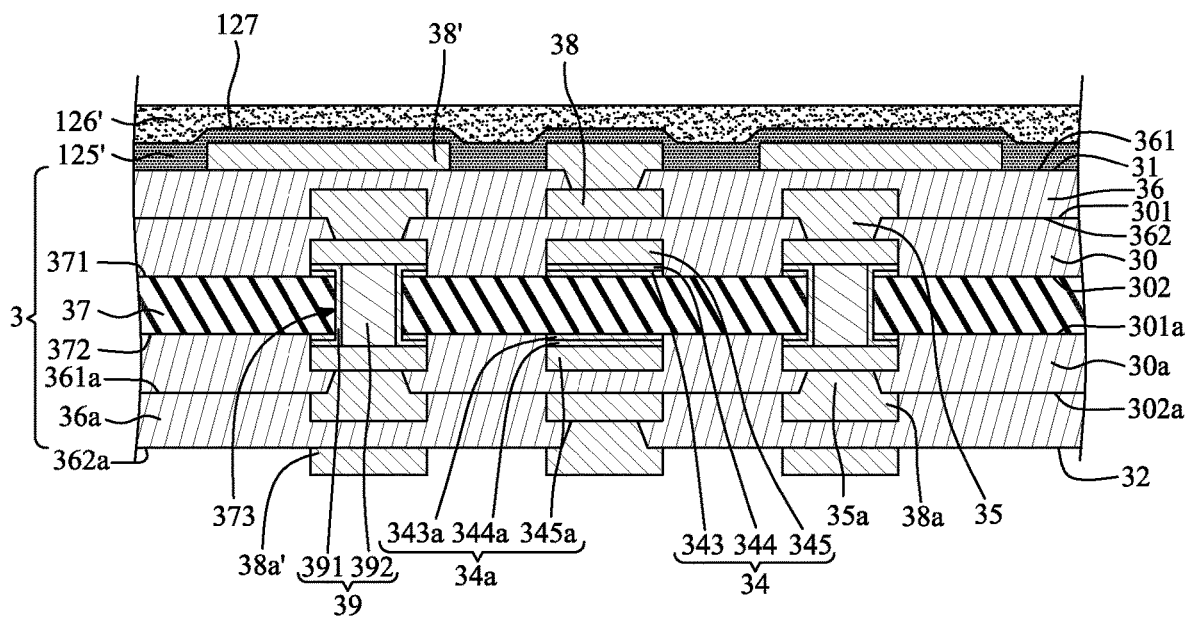
FIG. 35 illustrates one or more stages of an example of a method for manufacturing a wiring structure according to some embodiments of the present disclosure.

Referring to FIG. 35, a second polymeric material 126' is formed or applied on the top surface of the first polymeric material 125'. The top surface of the second polymeric material 126' is a substantially smooth flat surface due to a relative low viscosity of the second polymeric material 126'.

Figure 36:
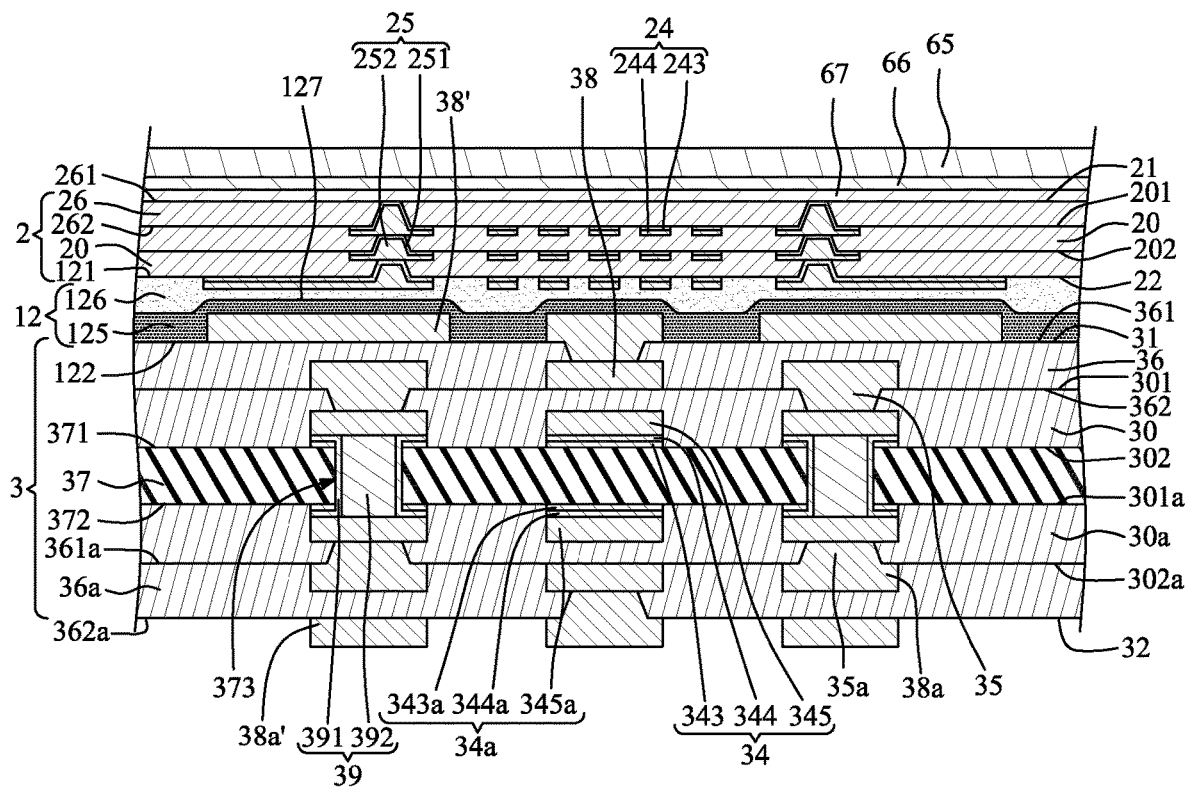
FIG. 36 illustrates one or more stages of an example of a method for manufacturing a wiring structure according to some embodiments of the present disclosure.

Referring to FIG. 36, the upper conductive structure 2 is attached to the lower conductive structure 3 through the first polymeric material 125' and the second polymeric material 126'. Then, the first polymeric material 125' and the second polymeric material 126' are cured to form a first sub-layer 125 and a second sub-layer 126, respectively. Meanwhile, an intermediate layer 12 is formed. In some embodiments, the upper conductive structure 2 may be pressed onto the lower conductive structure 3. Thus, the thickness of the intermediate layer 12 is determined by the gap between the upper conductive structure 2 and the lower conductive structure 3. Since the top surface of the second polymeric material 126' is a substantially smooth flat surface, the bonding quality between the upper conductive structure 2 and the lower conductive structure 3 is improved. In addition, a thickness of the intermediate layer 12 (e.g., a sum of a thickness of the first sub-layer 125 and a thickness of the second sub-layer 126) may be reduced.

Figure 37:
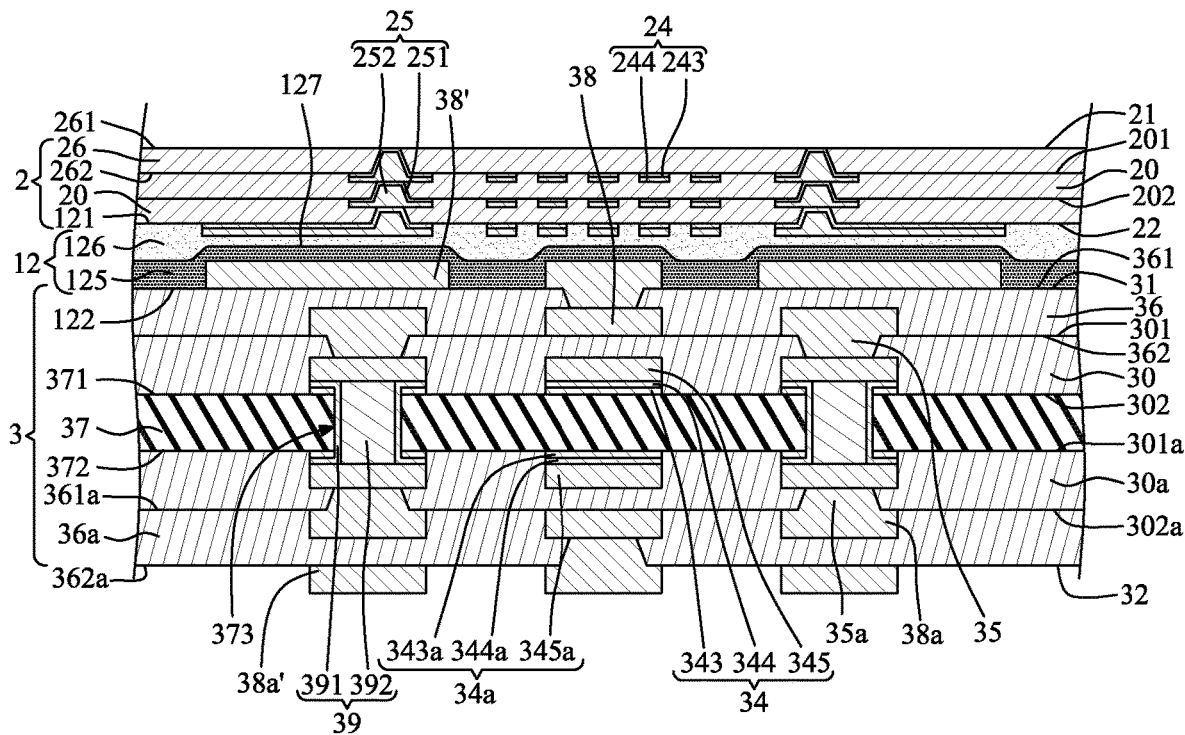
FIG. 37 illustrates one or more stages of an example of a method for manufacturing a wiring structure according to some embodiments of the present disclosure.

Referring to FIG. 37, the carrier 65, the release layer 66 and the conductive layer 67 are removed so as to expose a portion of the inner via 25.

Figure 38:
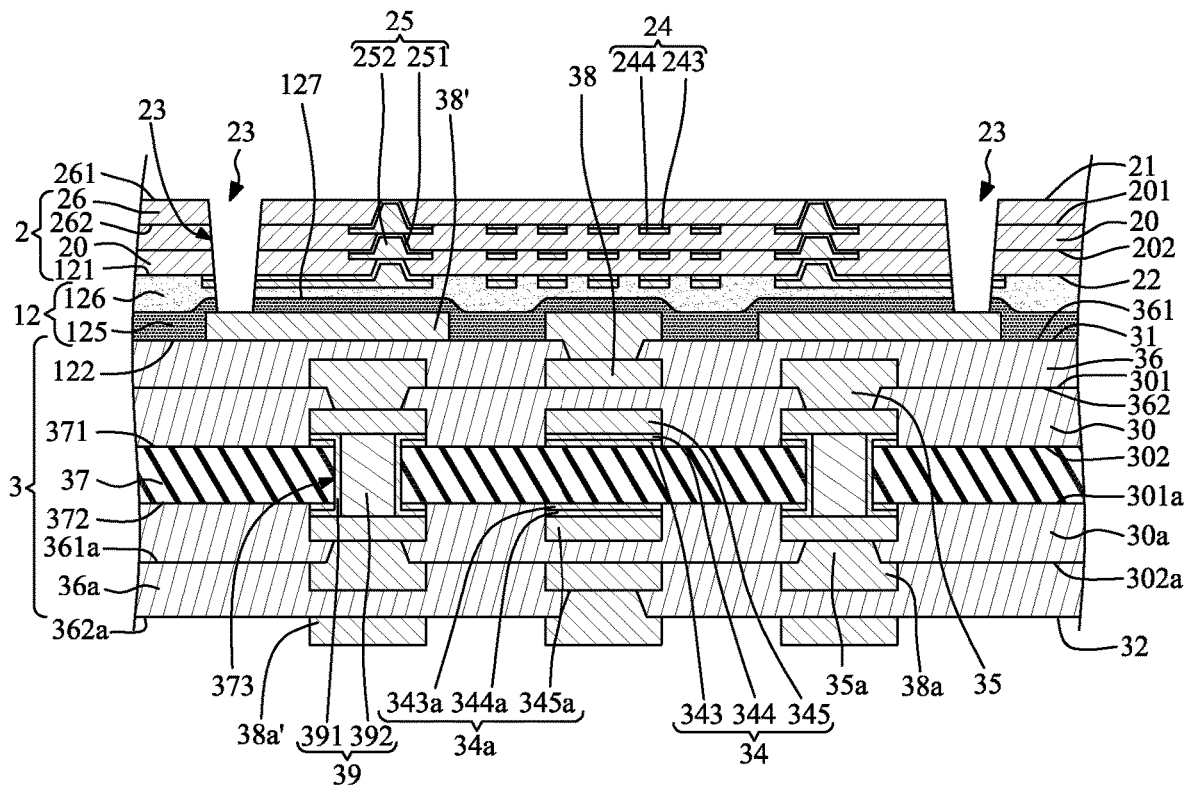
FIG. 38 illustrates one or more stages of an example of a method for manufacturing a wiring structure according to some embodiments of the present disclosure.

Referring to FIG. 38, at least one through hole 23 is formed to extend through at least a portion of the upper conductive structure 2 and the intermediate layer 12 by drilling (such as laser drilling) to exposes a circuit layer (e.g., second upper circuit layer 38') of the lower conductive structure 3. The through hole 23 tapers downwardly.

Figure 39:
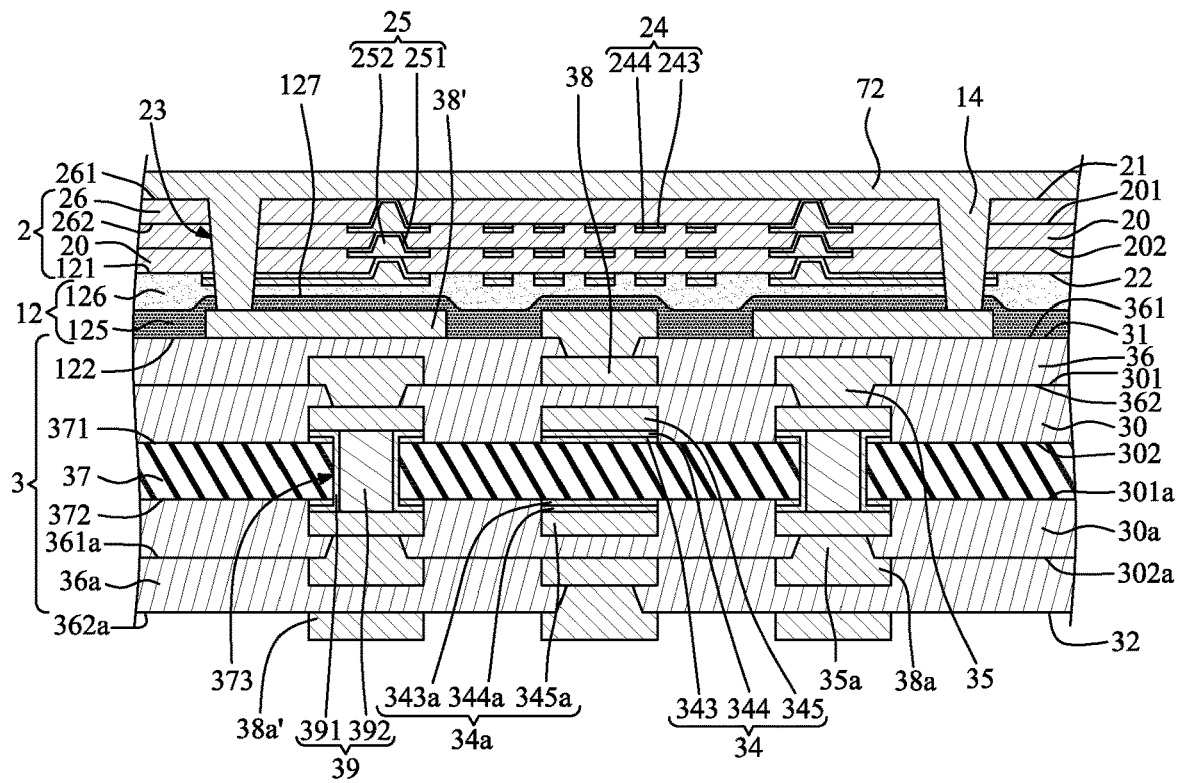
FIG. 39 illustrates one or more stages of an example of a method for manufacturing a wiring structure according to some embodiments of the present disclosure.

Referring to FIG. 39, a metallic layer 72 is formed on the surface 21 of the upper conductive structure 2 and in the through hole 23 to form at least one upper through via 14 in the through hole 23 by a plating technique or other suitable techniques.

Figure 40:
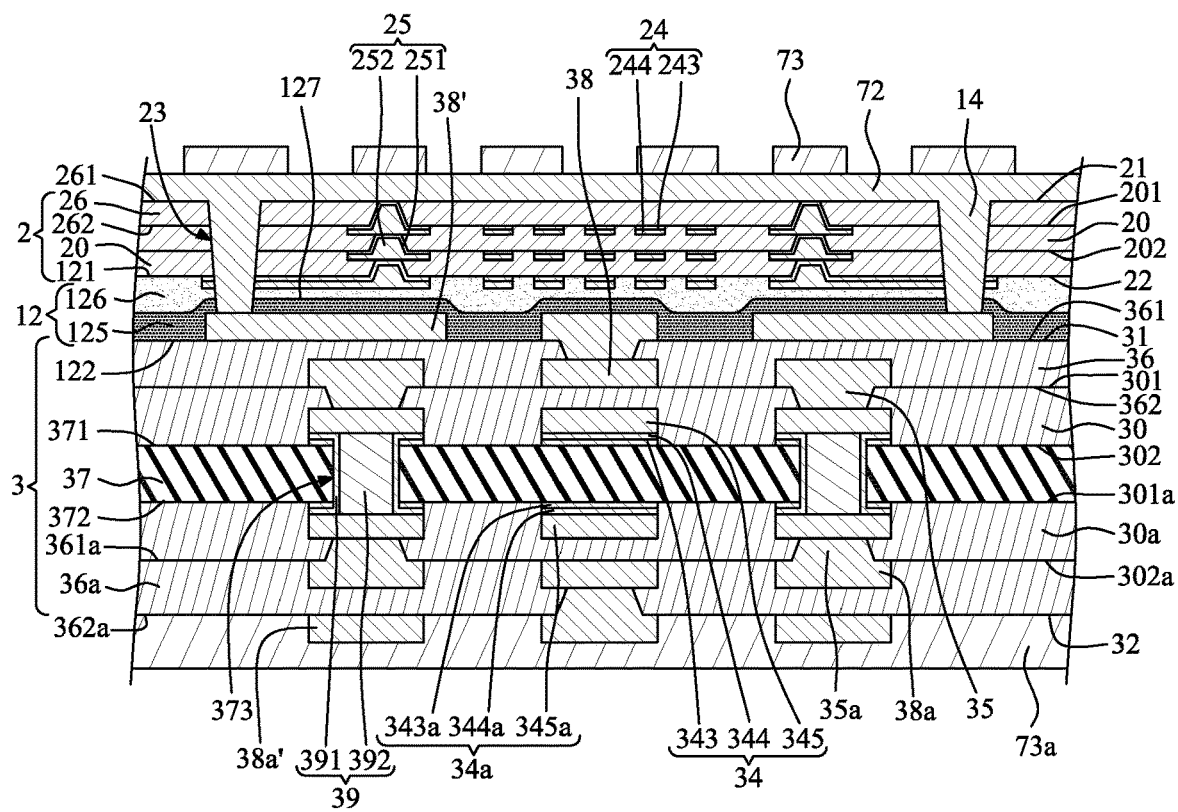
FIG. 40 illustrates one or more stages of an example of a method for manufacturing wiring structure according to some embodiments of the present disclosure.

Referring to FIG. 40, a top photoresist layer 73 is formed or disposed on the metallic layer 72, and a bottom photoresist layer 73a is formed or disposed on the bottom surface 32 of the lower conductive structure 3. Then, the top photoresist layer 73 is patterned by an exposure and development technique or other suitable techniques.

Figure 41:
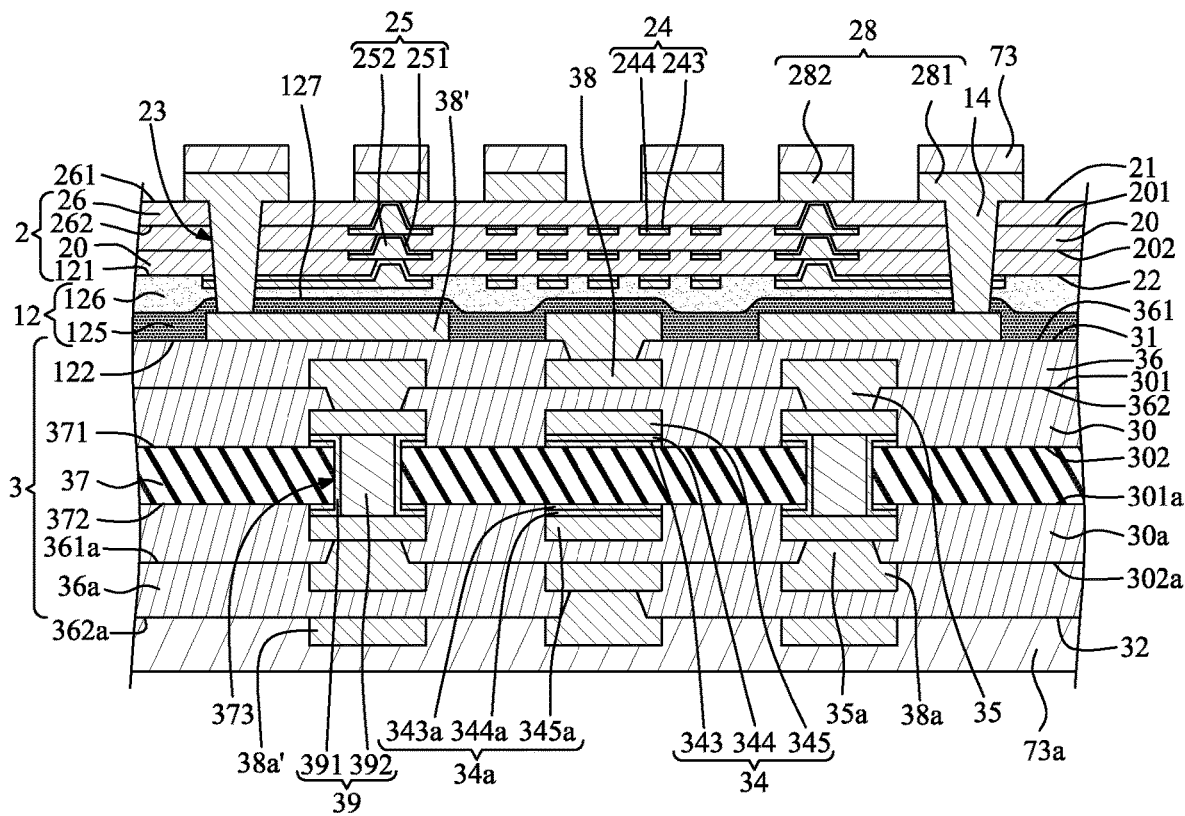
FIG. 41 illustrates one or more stages of an example of a method for manufacturing a wiring structure according to some embodiments of the present disclosure.

Referring to FIG. 41, portions of the metallic layer 72 that are not covered by the top photoresist layer 73 are removed by an etching technique or other suitable techniques. Portions of the metallic layer 72 that are covered by the top photoresist layer 73 remain to form a second circuit layer 28. Then, the top photoresist layer 73 and the bottom photoresist layer 73a are removed by a stripping technique or other suitable techniques, so as to obtain the wiring structure 1 of FIG. 1.

In some embodiments, a semiconductor chip 42 (FIG. 11) is electrically connected and bonded to the outer circuit layer 28 of the upper conductive structure 2 through a plurality of first connecting elements 44 (e.g., solder bumps or other conductive bumps). Then, the upper conductive structure 2, the intermediate layer 12 and the lower conductive structure 3 are singulated concurrently, so as to from a package structure 4 as shown in FIG. 11. The package structure 4 includes a wiring structure 1h and the semiconductor chip 42. Then, the second lower circuit layer 38a' of the lower conductive structure 3h is electrically connected and bonded to a substrate 46 (e.g., a mother board such as a PCB) through a plurality of second connecting elements 48 (e.g., solder bumps or other conductive bumps).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
an upper conductive structure including at least one dielectric layer and at least one circuit layer in contact with the dielectric layer;
a lower conductive structure including at least one dielectric layer and at least one circuit layer in contact with the dielectric layer;
an intermediate layer disposed between the upper conductive structure and the lower conductive structure and bonding the upper conductive structure and the lower conductive structure together, wherein the upper conductive structure is electrically connected to the lower conductive structure, the intermediate layer includes a plurality of sub-layers, each of the sub-layers is formed from a polymeric material, and a boundary is formed between two adjacent sub-layers; and
at least one upper through via extending through the upper conductive structure and the intermediate layer from a top surface of the upper conductive structure downward, wherein the upper through via tapers downwardly.

2. The wiring structure of claim 1, wherein a line space of the circuit layer of the lower conductive structure is greater than a line space of the circuit layer of the upper conductive structure.

3. The wiring structure of claim 1, wherein the lower conductive structure further includes a core portion, the at least one lower dielectric layer and the at least one lower circuit layer of the lower conductive structure are disposed adjacent to a surface of the core portion.

4. The wiring structure of claim 1, wherein the intermediate layer does not include a horizontally extending circuit layer on the boundary.

5. The wiring structure of claim 1, wherein a material of each of the polymeric materials is different from a material of the dielectric layer of the upper conductive structure and a material of the dielectric layer of the lower conductive structure.

6. The wiring structure of claim 1, wherein each of the polymeric materials has a viscosity, and the viscosities of the polymeric materials of two adjacent sub-layers are different from each other.

7. The wiring structure of claim 1, wherein the intermediate layer includes a first sub-layer formed from a first polymeric material and a second sub-layer formed from a second polymeric material, a viscosity of the first polymeric material is greater than a viscosity of the second polymeric material.

8. The wiring structure of claim 7, wherein the first sub-layer is in contact with the lower conductive structure and covers a topmost circuit layer of the lower conductive structure, and the second sub-layer is in contact with the upper conductive structure.

9. The wiring structure of claim 8, wherein the first sub-layer has a top surface having a highest point and a lowest point, and a height difference between the highest point and the lowest point is greater than 3 μm.

10. The wiring structure of claim 8, wherein the first sub-layer has a top surface having a highest point and a lowest point, and a height difference between the highest point and the lowest point is greater than one third of a thickness of the topmost circuit layer of the lower conductive structure.

11. The wiring structure of claim 7, wherein a material of the first polymeric material includes polyimide (PI), and a material of the second polymeric material includes Ajinomoto build-up film (ABF).

12. The wiring structure of claim 7, wherein the first sub-layer is in contact with the upper conductive structure, and the second sub-layer is in contact with the lower conductive structure and covers a topmost circuit layer of the lower conductive structure.

13. The wiring structure of claim 1, wherein the intermediate layer includes a first sub-layer formed from a first polymeric material, a second sub-layer formed from a second polymeric material, and a third sub-layer formed from a third polymeric material, wherein the second sub-layer is interposed between the first sub-layer and the third sub-layer, a viscosity of the first polymeric material is greater than a viscosity of the second polymeric material, and a viscosity of the third polymeric material is greater than the viscosity of the second polymeric material.

14. The wiring structure of claim 13, wherein the first sub-layer is in contact with the lower conductive structure and covers a topmost circuit layer of the lower conductive structure, and the third sub-layer is in contact with the upper conductive structure.

15. The wiring structure of claim 1, wherein the intermediate layer includes a first sub-layer formed from a first polymeric material, a second sub-layer formed from a second polymeric material, and a fourth sub-layer formed from a fourth polymeric material, wherein the first sub-layer is interposed between the second sub-layer and the fourth sub-layer, a viscosity of the second polymeric material is less than a viscosity of the first polymeric material, and a viscosity of the fourth polymeric material is less than the viscosity of the first polymeric material.

16. The wiring structure of claim 15, wherein the second sub-layer is in contact with the lower conductive structure and covers a topmost circuit layer of the lower conductive structure, and the fourth sub-layer is in contact with the upper conductive structure.

17. The wiring structure of claim 1, wherein the upper through via is electrically connected to the circuit layer of the lower conductive structure.

18. The wiring structure of claim 1, further comprising at least one lower through via extending through at least a portion of the lower conductive structure and the intermediate layer, and electrically connected to the circuit layer of upper lower conductive structure.

19. A wiring structure, comprising:
   an upper conductive structure including at least one dielectric layer and at least one circuit layer in contact with the dielectric layer;
   a lower conductive structure including at least one dielectric layer and at least one circuit layer in contact with the dielectric layer; and
   an intermediate layer disposed between the upper conductive structure and the lower conductive structure and bonding the upper conductive structure and the lower conductive structure together, wherein the upper conductive structure is electrically connected to the lower conductive structure, the intermediate layer includes a plurality of sub-layers, materials of the sub-layers are different from a material of the dielectric layer of the lower conductive structure and a material of the dielectric layer of the upper conductive structure, and materials of at least two of the sub-layers are different from each other.

20. The wiring structure of claim 19, wherein a boundary is formed between two adjacent sub-layers, and the intermediate layer does not include a horizontally extending circuit layer on the boundary.

21. The wiring structure of claim 19, wherein the intermediate layer includes a first sub-layer in contact with the lower conductive structure and a second sub-layer in contact with the upper conductive structure, a bonding force between the first sub-layer and the lower conductive structure is greater than a bonding force between the second sub-layer and the upper conductive structure.

22. The wiring structure of claim 19, wherein the intermediate layer includes a first sub-layer in contact with the upper conductive structure and a second sub-layer in contact with the lower conductive structure, a bonding force between the first sub-layer and the upper conductive structure is greater than a bonding force between the second sub-layer and the lower conductive structure.

23. The wiring structure of claim 19, wherein the intermediate layer includes a first sub-layer in contact with the lower conductive structure, a third sub-layer in contact with the upper conductive structure, and a second sub-layer interposed between the first sub-layer and the third sub-layer, wherein a material of the first sub-layer is same as a material of the third sub-layer, and is different from a material of the second sub-layer.

24. A wiring structure, comprising:
   a low-density stacked structure including at least one dielectric layer and at least one low-density circuit layer in contact with the dielectric layer;
   a high-density stacked structure disposed on the low-density stacked structure, wherein the high-density stacked structure includes at least one dielectric layer and at least one high-density circuit layer in contact with the dielectric layer of the high-density stacked structure;
   an intermediate layer disposed between the low-density stacked structure and the high-density stacked structure and bonding the low-density stacked structure and the high-density stacked structure together, wherein the low-density stacked structure is electrically connected to the high-density stacked structure, the intermediate layer includes a plurality of sub-layers, each of the sub-layers is formed from a polymeric material, and a boundary is formed between two adjacent sub-layers; and
   at least one upper through via extending through the high-density stacked structure and the intermediate layer from a top surface of the high-density stacked structure downward, wherein the upper through via tapers downwardly.

25. The wiring structure of claim 24, wherein the intermediate layer does not include a horizontally extending circuit layer on the boundary.

26. The wiring structure of claim 24, wherein a material of each of the polymeric materials is different from a material of the dielectric layer of the low-density stacked structure and a material of the dielectric layer of the high-density stacked structure.

* * * * *